United States Patent [19]

Kakubo et al.

[11] Patent Number: 4,706,291
[45] Date of Patent: Nov. 10, 1987

[54] REVERBERATION IMPARTING DEVICE

[75] Inventors: Yuji Kakubo; Koji Niimi; Yuji Ikegaya, all of Hamamatsu, Japan

[73] Assignee: Nippon Gakki Seizo Kabushiki Kaisha, Hamamatsu, Japan

[21] Appl. No.: 877,442

[22] Filed: Jun. 23, 1986

[30] Foreign Application Priority Data

Jun. 25, 1985 [JP] Japan .................................. 60-138397
Jun. 25, 1985 [JP] Japan .............................. 60-96523[U]

[51] Int. Cl.$^4$ ............................................. H03G 3/00
[52] U.S. Cl. ................................ 381/63; 84/DIG. 26
[58] Field of Search ............ 381/62, 63; 84/DIG. 26, 84/1.24, 1.25

[56] References Cited

U.S. PATENT DOCUMENTS 4,005,268 1/1977 Canell et al. ........................... 381/63
4,489,439 12/1984 Scholz et al. ......................... 381/63
4,586,417 5/1986 Kato et al. ............................ 381/63

Primary Examiner—Forester W. Isen
Attorney, Agent, or Firm—Spensley Horn Jubas & Lubitz

[57] ABSTRACT

A reverberation imparting device comprises a prememory storing an input signal, a level detection circuit responsive to data stored in the prememory for detecting presence or absence of the input signal, a data memory storing a delayed input signal delivered out of the prememory, a fixed type convolution operation circuit for producing a reverberation signal with respect to the data stored in the prememory by using an initial portion of parameters of a reflected sound, an adaptive type convolution operation circuit for producing a reverberation signal with respect to data stored in the data memory by using a plurality of parameters of more significant bits among the remaining portion of the parameters of the reflected sound, and an adder for adding outputs of the fixed type and adaptive type convolution circuits and delivering out the result of addition as a reverberation signal. In one aspect of the invention, the reverberation imparting device further comprises a frequency characteristics control circuit for controlling frequency characteristics of a reverberation sound and a frequency characteristics setting circuit for timewise changing filter characteristics of the frequency characteristics control circuit.

5 Claims, 37 Drawing Figures

REVERBERATION IMPARTING DEVICE

FIELD OF THE INVENTION

This invention relates to a device for producing a reverberation sound for an input signal such as a musical tone signal by superposing, by convolution operation, delay signals for the input signal prepared on the basis of the impulse response and, more particularly, to a device of this type capable of preventing delay between input and output signals in an adaptive type convolution operation. The invention relates also to a device of this type capable of timewise controlling frequency characteristics of a reverberation sound.

BACKGROUND OF THE INVENTION

For adding an artificial reverberation to a signal such as a tone signal by electronic means, the most direct method is one in which a reverberation sound is produced by superposing signals having different time delays relative to a direct sound in correspondence to the impulse response in an imaginary acoustic field such as an auditorium. If the impulse response in the imaginary acoustic field is expressed by a train of reflected sounds having a delay time $\tau_i$ and a level $g_i$ (i being 1, 2, ..., n) with respect to a direct sound $R_0$ as shown in FIG. 1, a reverberation sound is produced by preparing reflected sounds for each sample of an input signal using the delay time $\tau_i$ and level $g_i$ as parameters (reflected sound parameters) and superposing these reflected sounds for each sample with respect to the same time point (an operation such as this in which delay signals are multiplied with gains and added together is called a "convolution operation").

The principle of the convolution operation is shown in FIG. 2. Referring to FIG. 2, each sampled value of an input signal is applied to a shift register 1 having a plurality of taps and shifted successively at each sampling period. During one sampling period, delay signals $x_1$ to $x_n$ for each sampled value are provided from the respective taps corresponding to delay times $\tau_1$ to $\tau_n$ and these delay signals are supplied with coefficients (gains) $g_1$ to $g_n$ by multipliers (amplifiers) 2-1, 2-2, ..., 2-n thereafter are added together in an adder 3 to provide a sampled value of a reverberation signal which is $$X_{out} = \sum_{i=1}^{n} X_i \cdot g_i.$$

Specifically, a sampled value of a reverberation signal is produced in a manner shown in FIG. 3. In FIG. 3, each sampled value of an input signal is stored in a data memory 10. Delay time data $\tau_1$ to $\tau_n$ are sequentially read out from a parameter memory 12 and, using this data as the address signal, delay signals $x_1$ to $x_n$ corresponding to respective delay time $\tau_1$ to $\tau_n$ are sequentially read out from the data memory 10. The read out delay signals $x_1$ to $x_n$ are multiplied with coefficients $g_1$ to $g_n$ in a multiplier 14 to sequentially produce individual reflected sound signals $x_1 \cdot g_1$ through $x_n \cdot g_n$. A sampled value of a reverberation signal is produced by accumulating these reflected sound signals by an accumulator 16 consisting of an adder 18 and a register 20. The above described operation is repeated each time a new input signal is applied to the data memory 10 and a series of reverberation signals are thereby produced.

In the above described convolution operation according to the serial sequential processing, one sampled value of a reverberation signal must be produced by performing the above described series of operations within one sampling period of an input signal. The number of points for the convolution operation within one sampling period, i.e., the number of times the accumulator 16 accumulates data supplied with the coefficients within one sampling period, however, is limited by the operation speed of the device.

For obtaining a reverberation sound which is as natural as possible, it is desirable to increase the amount of information as much as possible by increasing the number of convolution points, that is, increase the number of the reflected sound paratmeters ($\tau_i \cdot g_i$) employed as much as possible. This however is difficult for the above described reason. In this regard, there can be assumed a device which attempts to obtain a reverberation sound by suitably thinning the reflected sound parameters. This however brings about coarseness in the density of the reflected sounds on the time axis resulting in unnaturalness in the produced reverberation sound.

There can be assumed also an attempt which, utilizing the phenomenon that, in a case where the input signal is continuously applied, the latter half of the reverberation sound which is of a smaller level tends to become masked by a succeeding input signal and thereby become less audible, uses only an initial portion of the reflected sound parameters, discarding a latter portion thereof. This method is effective when the input signal is continuously applied but, when the input signal is interrupted, the reverberation sound also is interrupted suddenly, leaving an unnatural impression to the hearer.

For overcoming these inconveniences, there has been proposed an adaptive type reverberation imparting device (Japanese Patent Preliminary Publication No. Sho 60-73694). According to this adaptive type device, a predetermined number of reflected sound parameters of more significant bits are selectively used when the input signal is continuously applied and, when the input signal has been interrupted, the reflected sound parameters to be used are sequentially shifted to those of less significant bits. By this arrangement, all of the reflected sound parameters with respect to several samples immediately before the input signal is interrupted are sequentially used to form reflected sounds and, accordingly, a long and natural reverberation sound is obtained.

In the adaptive type reverberation imparting device, the operation for producing a reverberation sound is switched from a fixed type operation, in which the reflected sound parameters used are fixed to a predetermined number of parameters of more significant bits, to an adaptive type operation in which the parameters used are sequentially shifted to those of less significant bits upon detection of the fact that the input signal has reached a zero level or a predetermined decreased level. For determining whether the detection of such level signifies a mere zero or such predetermined level crossing of the signal waveshape or interruption of the input signal, this device requires a relatively long period of time in the order of several ten milliseconds for continuously examining the level of the input signal. Besides, in the adaptive type device, the adaptive type operation must be performed retroactive to the initial input signal portion in the detection period if the interruption of the signal has been found. The input signal must therefore be always delayed by the detection period with a result that time delay is produced between the input signal and the output signal. This will be discussed more in detail below.

FIG. 4 shows an example of the prior art adaptive type reverberation imparting device.

Sampled values of an input signal are stored once in a prememory 22 in a zero detection section 5 and sequentially transferred to a data memory 24 in an adaptive type convolution operation section 6 after being delayed by a period of several ten milliseconds during which the zero detection is effected.

A zero detection circuit 26 accumulates sampled values of several ten milliseconds stored in the prememory 22 and, when the accumulated value is higher than a certain threshold value, it judges that the input signal is continuously being applied whereas, when the accumulated value is lower than the threshold value, it judges that the input signal has been interrupted.

The sampled values of the input signal delivered out of the prememory 22 are sequentially applied to the data memory 24 and written therein from the oldest sampled value and sequentially renewed.

An impulse response delay memory 30 stores parameter $\tau_i$ (i being 1, 2, . . . , n) of the delay time. An impulse response level memory 32 stores parameter $g_i$ (i being 1, 2, . . . , n) of the level.

A counter 28 is provided for controlling operation timing of the adaptive type convolution operation A sequence controller 34 is provided for selecting which of the parameters ($\tau_i$, $g_i$) totalling n stored in the delay memory 30 and the level memory 32 should be used as parameters totalling k for forming one sampled value of the reverberation sound. That is, the sequence controller 34 controls the device to perform the fixed type operation such that k parameters ($\tau_i \cdot g_i$) through ($\tau_k \cdot g_k$) from the first one are sequentially read out in response to the count in the counter 28 while the input signal is continuously applied.

Upon detection of the interruption of the input signal by the zero detection circuit 27, the sequence controller 34 controls the device to perform the adaptive type operation. In the adaptive type operation, time t from the start of the operation (i.e., the time elapsing since the input signal has been interrupted) is measured and parameters totalling k from the most significant bit which satisfy the relation $t \leq \tau_i$ are used. Since the time t is $t=0$ initially, the parameters ($\tau_1$, $g_1$) through ($\tau_k$, $g_k$) are used. As the time t becomes $\tau_2 \geq t > \tau_1$, the parameters ($\tau_2$, $g_2$) through ($\tau_{k+1}$, $g_{k+1}$) are used. Further, as the time t becomes $\tau_3 \geq t > \tau_2$, the parameters ($\tau_3$, $g_3$) through ($\tau_{k+2}$, $g_{k+2}$) are used. In this manner, the range of the parameters used is sequentially shifted to less significant bits. The accumulated value of the convolution operation decreases as the range of the parameters is shifted so that the reverberation sound is gradually attenuated. Thus, the reverberation sound completely dies away $\tau_n$ after the input signal was interrupted.

An address controller 36 is provided for designating write addresses and read addresses in the data memory 24. As to the write address, the address for the oldest sampled value is sequentially designated and the address is renewed for a new sampled value. As to the read address, an address corresponding to the delay time parameter $\tau_i$ is designated on the basis of the write address (since the write address is sequentially shifted at each sampling period, the read address corresponding to $\tau_i$ should be correspondingly shifted) and a delay signal $x_i$ at the read address is read out. The address controller 36 supplies address information concerning the present address to the sequence controller 34.

Writing into the data memory 24 is prohibited upon detection of the zero level and is resumed upon starting of application of the input signal again.

A convolution operation circuit 38 sequentially multiplies the delay signal $x_i$ read out sequentially from the data memory 24 with the corresponding level parameter $g_i$ read out from the impulse response level memory 32 and accumulates the products of the multiplication to produce one sampled value of a reverberation sound. Thus, one sampled value of the reverberation sound is produced at each sampling period of the input signal and a series of reverberation signals are produced by repeating the above described operation.

FIG. 5 shows the operation of the reverberation imparting device shown in FIG. 4 in the order of a to m. The respective states a to m represent states at time points indicated by arrows at the right ends of these states. States of the memories (i.e., the prememory 22 and the data memory 24) are indicated above and the parameters are indicated below in each set of the states. In each state of the memories, a shaded portion indicated by oblique lines extending in a single direction represents a state in which a sampled value of the input signal shown above it is stored in the memories. In each state of the parameters, a shaded portion indicated by oblique lines extending in a single direction represents parameters ($\tau_i$, $g_i$) selected at that time point. In each state of the memories, a shaded portion indicated by crossing oblique lines represents a sampled value of the input signal which is subject to the convolution operation using the selected parameters.

Among the symbols a to m representing the respective states, those encircled by a single circle indicate a state in which the fixed type convolution operation is performed i.e., the convolution operation is performed using k parameters ($\tau_1$, $g_1$) through ($\tau_k$, $g_k$) from the first one. The states encircled by double circles indicate a state in which the adaptive type convolution operation is performed, i.e., the convolution operation is performed with the selected parameters being sequentially shifted to less significant bits.

The output signal shown at the bottom of FIG. 5 represents a series of reverberation signals formed by connecting results of the convolution operation (accumulated values), i.e., sampled values of a reverberation sound. It will be understood from this figure that the output signal has a delay to the input signal in the amount corresponding to the time during which the input signal is held in the prememory 22. This causes a difference between the direct sound and the reverberation sound which brings about unnaturalness in the reverberation sound produced. This problem can be overcome in the case of playback of a record disc by delaying the direct sound by length of time equivalent to this difference. In the case of a live performance of a musical instrument or a live vocal performance, however, no artificial delay can be applied to sounds of such live performance so that the problem of the delay between the input and output signals remains unsettled.

In the prior art reverberation imparting device, no particular consideration has been given to frequency characteristics of a reverberation signal produced in the above described manner. In a natural reverberation sound, however, frequency characteristics change with elapse of time. That is, the higher the frequency component, the faster it is attenuated with a result that only a low frequency component remains after elapse of some time. If, accordingly, frequency characteristics of a reverberation signal to be produced can be timewise controlled in the process of imparting reverberation, a more natural reverberation sound can be artificially produced. Besides, additional conveniences such as imparting special tonal effects will be derived if frequency characteristics of a reverberation sound can be timewise controlled.

SUMMARY OF THE INVENTION

It is a frist object of the invention to provide a reverberation imparting device capable of preventing delay between input and output signals in the production of a reverberation sound utilizing the adaptive type convolution operation.

It is a second object of the invention to provide a reverberation imparting device capable of timewise controlling frequency characteristics of a reverberation sound to be produced.

The first object of the invention is achieved by performing a fixed type convolution operation using an initial portion of reflected sound parameter with respect to data of a prememory which detects presence or absence of an input signal, performing an adaptive type convolution operation using the rest of reflected sound parameter with respect to data of a data memory to which delayed data is applied from the prememory and adding results of these convolution operations together.

The reverberation imparting device achieving the first object of the invention is characterized in that it comprises a prememory sequentially storing an input signal, level detection means responsive to data stored in the prememory for detecting presence or absence of the input signal, a data memory sequentially storing the input signal delivered out of the prememory after delay of a predetermined time length, fixed type convolution operation means for producing a reverberation signal with respect to the data stored in the prememory by using an initial portion of parameters of a reflected sound, adaptive type convolution operation means for producing a reverberation signal with respect to data stored in the data memory by using a plurality of parameters of more significant bits among the remaining portion of the parameters of the reflected sound except one corresponding to delay time for a portion in which absence of the input signal has been detected by the level detection means, and addition means for adding resulting outputs of the fixed type convolution operation means and the adaptive type convolution operation means and delivering out the result of the addition.

According to the device of the invention, reflected sound of the initial portion is produced in the prememory in which there is no delay in the input signal so that a reverberation sound finally obtained has no delay either. In the data memory in which a delayed signal is applied from the prememory, reflected sound after the initial portion (i.e., having longer delay time than delay time in the prememory) is produced so that a reverberation sound without delay can be produced also in the adaptive type convolution operation using data of the data memory. Accordingly, a reverberation sound closely simulating a natural reverberation sound can be produced in live music performances.

The second object of the invention can be achieved by imparting filter characteristics to data before or after producing a reverberation sound or to coefficient parameters of the impulse response and timewise changing such filter characteristics.

For achieving the second object, the reverberation imparting device is characterized in that it comprises the above described construction and further comprises a frequency characteristics control circuit for controlling frequency characteristics of a reverberation sound and frequency characteristics setting means for timewise changing filter characteristics of the frequency characteristcs conrol circuit.

According to this device, a natural reverberation sound can be closely simulated by timewise changing filter characteristics so that high frequency components will be attenuated promptly. Besides, various special tonal effects can be realized by suitably controlling the timewise change in the filter characteristics.

BRIEF DESCRIPTION OF THE DRAWINGS

In the accompanying drawings,

FIGS. 7 through 12 are diagrams for explaining the principle of the invention in which FIG. 7 shows the impulse response and FIGS. 8 through 12 schematically show operations of the device using the impulse response of FIG. 7 as parameters in various operation modes;

DETAILED DESCRIPTION OF THE INVENTION

Principle of the invention

Figure 7:
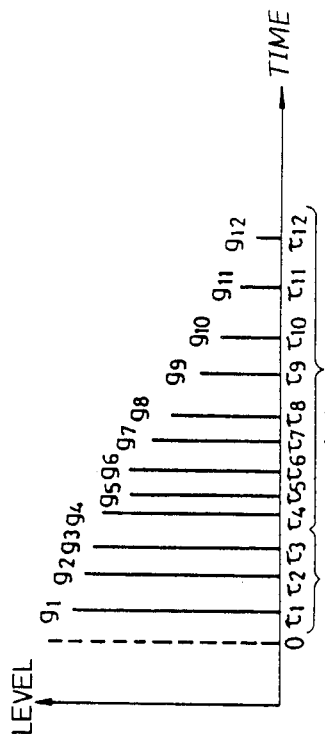

The principle of the invention will now be described with reference to FIGS. 7 through 12. Assume that, as shown in FIG. 7, there are twelve reflected sound parameters ($\tau_1$, $g_1$) through ($\tau_{12}$, $g_{12}$) among which eight parameters are used. In the eight parameters, the three parameters of the initial portion of more significant bits are used for performing the fixed type convolution operation for data in a prememory and the five parameters of less significant bits are used for performing the adaptive type convolution operation for data in a data memory.

For realizing this convolution operation, the prememory 22 and the data memory 24 are constructed of shift registers and input sampled values are sequentially shifted in accordance with a clock pulse of a period equivalent to the sampling period of the input signal. Signals are provided from taps of the prememory 22 and the data memory 24 corresponding to the delay times $\tau_1$–$\tau_{12}$ (the delay times of the respective taps of the data memory 24 are based on the time point at which the input signal is applied to the input of the prememory 22) and delivered to amplifiers 21-1 through 21-12 having respective gains $g_1$ through $g_{12}$.

As to the data in the prememory 22, all outputs of the amplifiers 21-1 through 21-3 are added together in a convolution operation circuit (adder) 48.

As to the data in the data memory 24, the selection circuit 23 receives outputs of the amplifiers 21-4 through 21-12 and outputs of five dummy amplifiers 21-D1 through 21-D5 provided on the less significant bit side of the amplifier 21-12 and having delay times satisfying the relation $\tau_{12} < \tau_{D1} < \ldots \tau_{D5}$ and selectively outputs any five of these outputs. The selected outputs are added together by a convolution operation circuit (adder) 38.

Outputs of the convolution operation circuits 48 and 38 are added together in an adder 50 and provided therefrom as one sampled value of a reverberation signal. By repeating this operation for each sampling period, a series of sampled values of the reverberation signal are produced.

A zero detection circuit 26 adds outputs of respective stages of the prememory 22 together in an adder 26 and the resulted added signal are compared with a predetermined threshold value in a comparator 25 to detect a zero state of the input signal (i.e., state in which no input signal is found). Upon detection of the zero state, the system on the side of the data memory 24 is switched to the adaptive type convolution operation.

The operation modes of the device according to the invention are shown in FIGS. 8 through 12. In the memories 22 and 24, shaded portions represent portions in which the signal is loaded and blank portions represent portions in which no signal is loaded. Amplifiers in channels used for the convolution operation are indicated in black.

Figure 8:
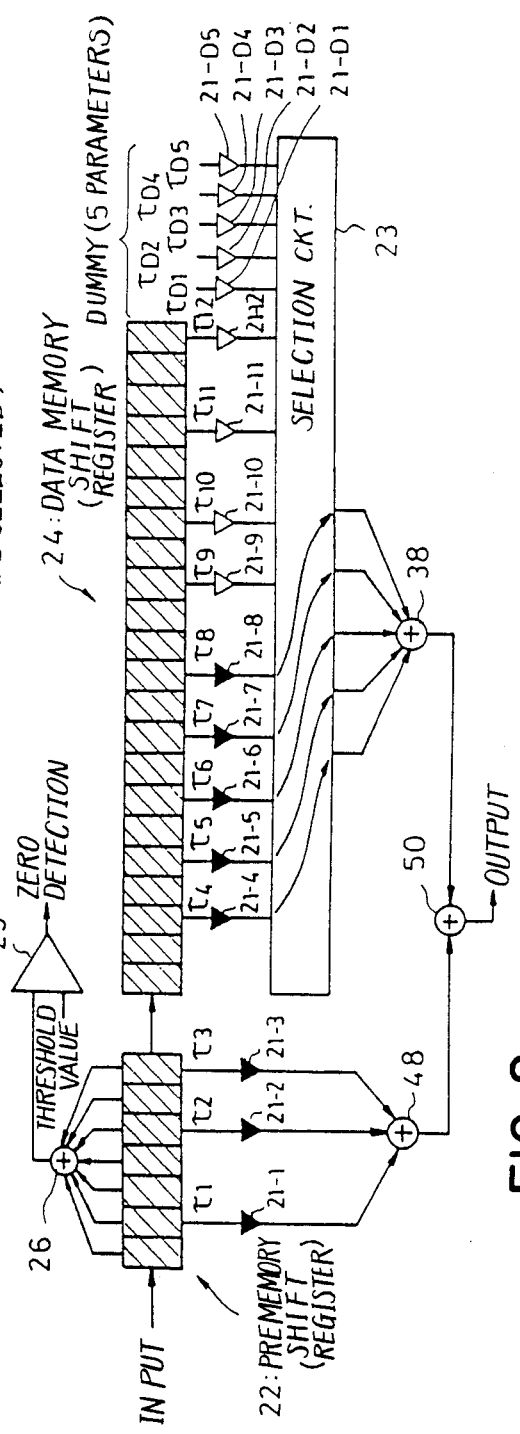

FIG. 8 shows a state in which the input signal is continuously applied. In this state, the input signal is loaded in the prememory 22 and five parameters ($\tau_4$, $g_4$) through ($\tau_8$, $g_8$) of more significant bits are selected in the data memory 24.

Figure 9:
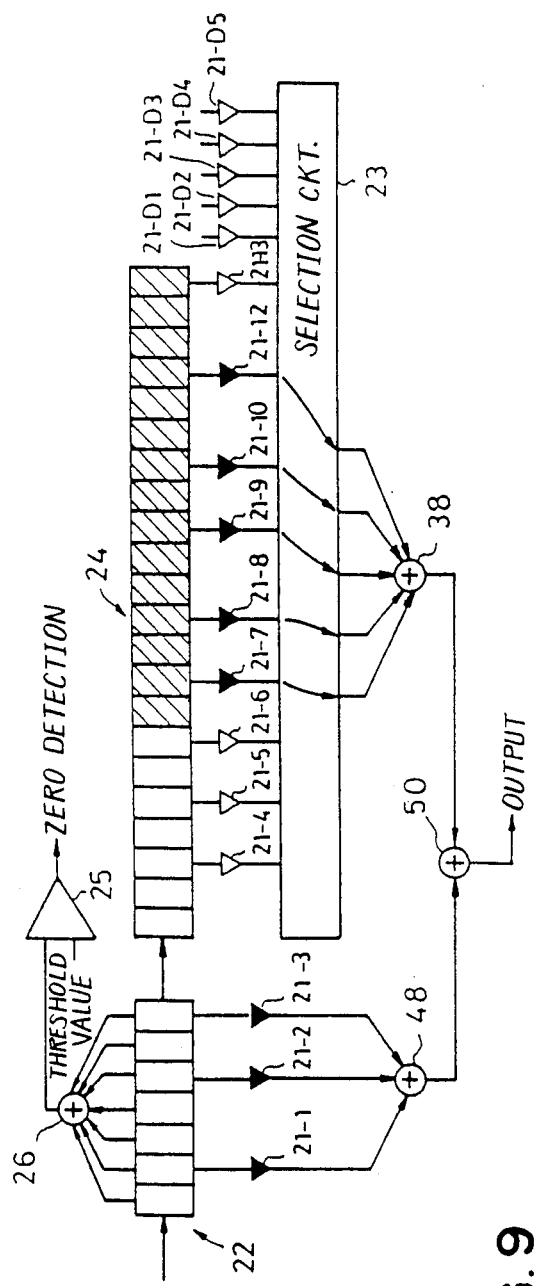

FIG. 9 shows a state in which the input signal has been interrupted. Since there is no signal in the prememory 22, the signal zero state has been detected and the system on the side of the data memory 24 performs the adaptive type operation, five parameters of more significant bits in a portion in which the signal is loaded being selected for use in the operation. As the portion in which no signal is loaded is shifted to less significant bits, the range in which the parameters are selected is shifted to less significant bits.

Figure 10:
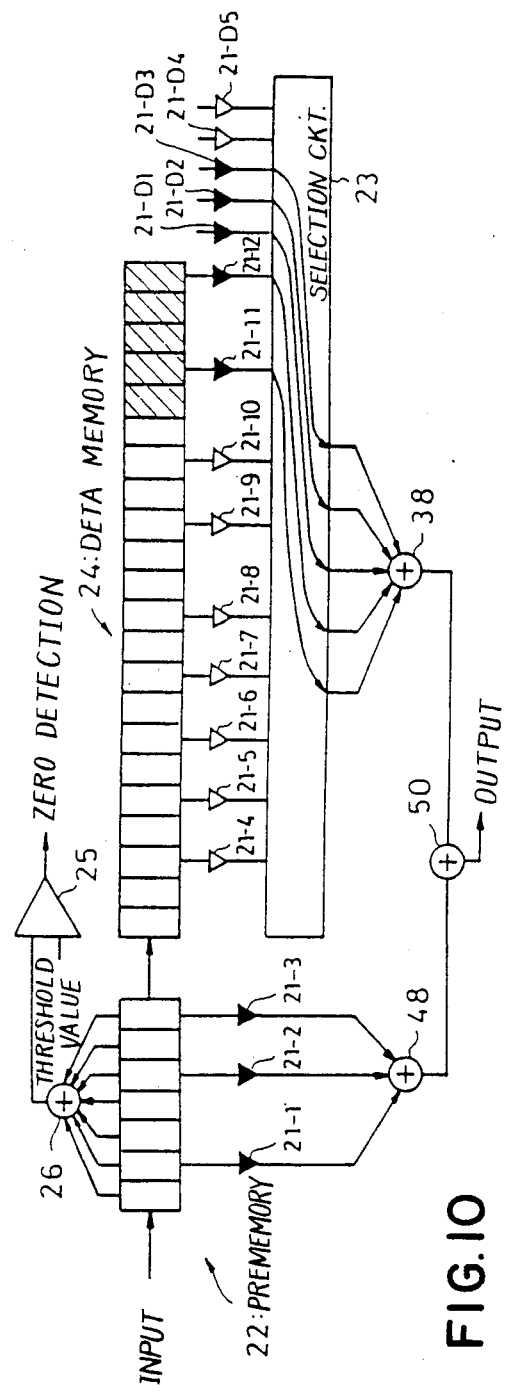

FIG. 10 shows a state in which the signal still remains interrupted. If there are less than five parameters in the portion in which the signal is loaded in the data memory 24, the rest of parameters are allotted to the dummy parameters. If there is no signal left in any part of the data memory 24, all of the five dummy parameters are selected. And, since there is no input signal in the dummy parameters, the output of the convolution operation circuit 38 is zero.

Figures 11, 12:
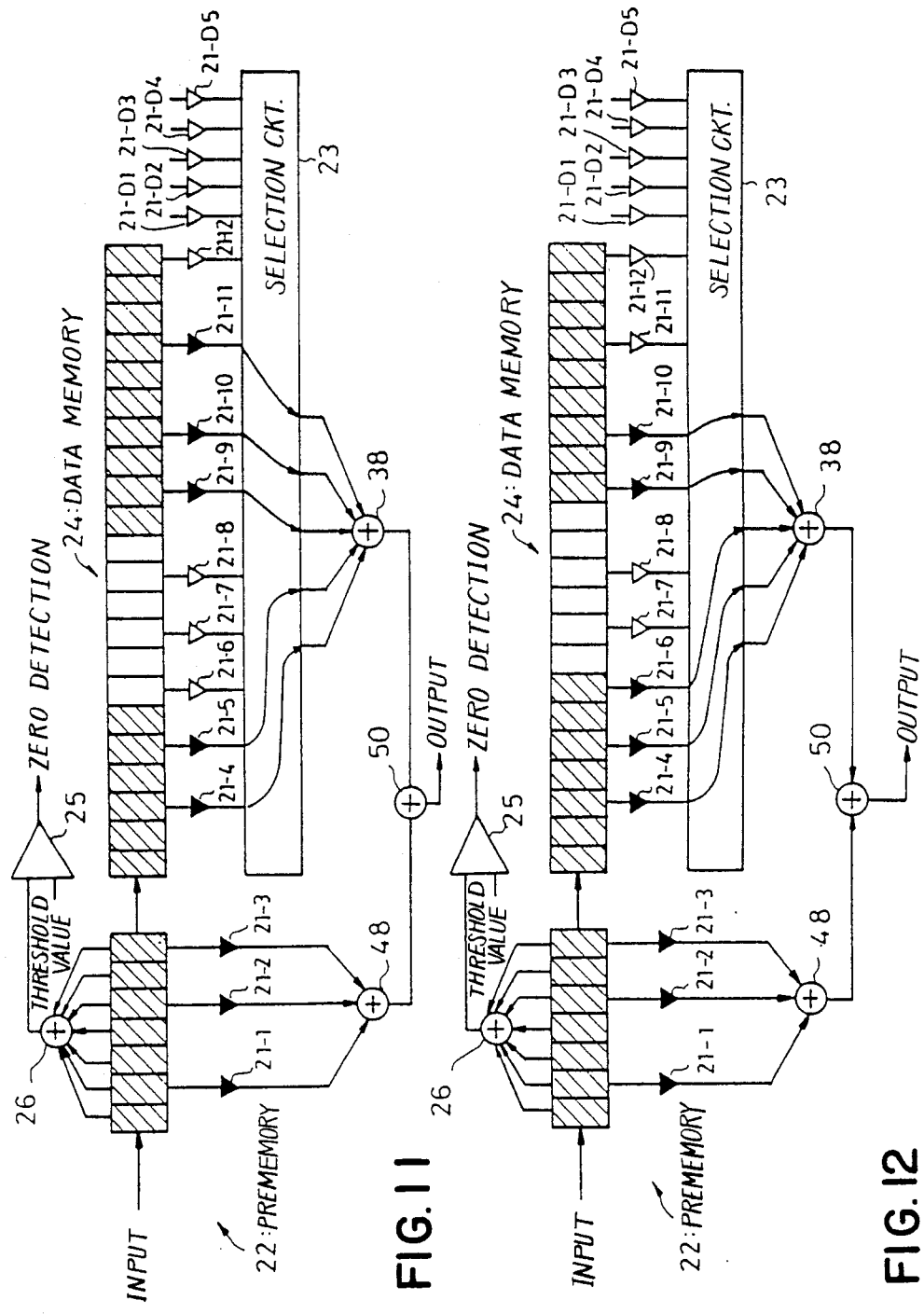

FIG. 11 shows a state in which the input signal has been temporarily interrupted and the convolution operation has been switched to the adaptive type operation and then the signal has been applied again while data before the interruption of the signal still remains in the data memory 24. Since at this time the signal is loaded in the prememory 22, the zero detection state has been terminated and the data memory 24 side is switched to the fixed type operation. That is, five parameters of more significant bits are selected. The new data loaded in the data memory 24 however is not sufficient for allocation of five parameters so that the rest of parameters are allocated to the remaining data before the interruption.

FIG. 12 shows a state in which one sampling period has elapsed from the state shown in FIG. 11. In the data memory 24, parameters allocated to the new data have increased by one and become three whereas parameters allocated to the old data before the interruption have decreased by one and become two. In this manner, parameters for the old data before the input signal was interrupted are transiently selected so that both fixed and adaptive type operations exist during this transient period of time.

FIGS. 11 and 12 show the state in which old data before the interruption of the input signal remains in the data memory 24. In a case where no signal exists in the data memory 24, the dummy parameters are selected and, accordingly, parameters of more significant bits are selected for new data and the dummy parameters are selected as the rest of parameters.

Summing up the operation of the device shown in FIGS. 8 through 12, the selection circuit 23 operates in such a manner that it selects five parameters of more significant bits excepting a portion in which no signal is loaded in the data memory 24.

In the prememory 22, all of the parameters ($\tau_1$, $g_1$) through ($\tau_3$, $g_3$) are used for the operation in all cases and outputs of the prememory 22 are added with the result of adaptive type convolution operation in an adder 50 and the result of the addition is provided by the adder 50.

On the side of the prememory 22, an initial portion of a reverberation signal is produced without delay with respect to the input signal. On the side of the data memory 24, although the signal applied to the data memory 24 is a signal which has been delayed in the prememory 22, delay times of parameters used on the side of the data memory 24 are later than delay times produced in the prememory 22 and delay times at the respective taps of the data memory 24 are based on the time point at which the input signal is applied to the input of the prememory 22 so that a reverberation signal of a portion after the initial portion can be produced without delay with respect to the input signal.

Embodiments

Figure 1:
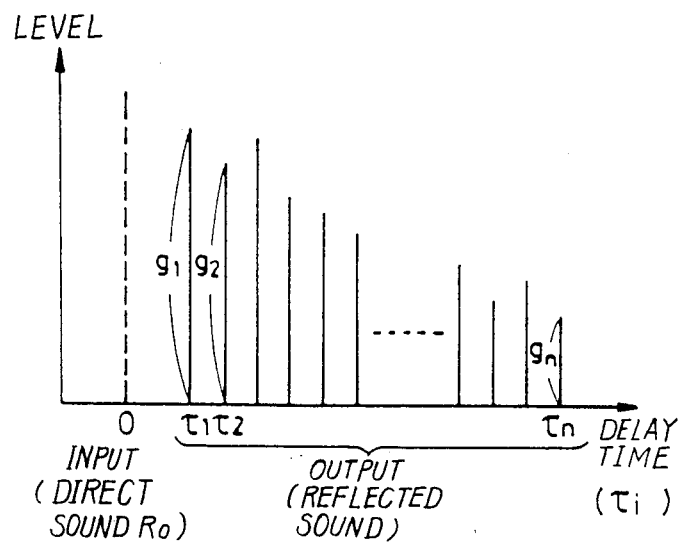
FIG. 1 is a diagram showing the impulse response in an imaginary acoustic field.
Figure 2:
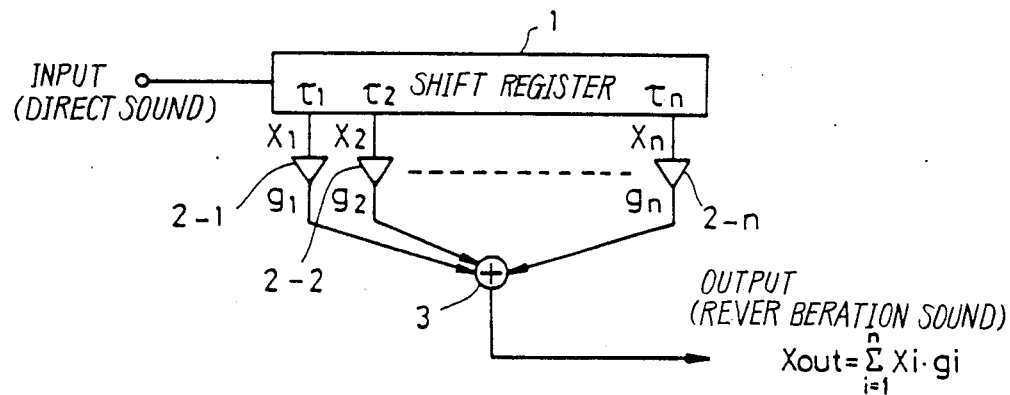
FIG. 2 is a diagram showing a basic concept of the reverberation imparting device utilizing the impulse response of FIG. 1 as parameters.
Figure 3:
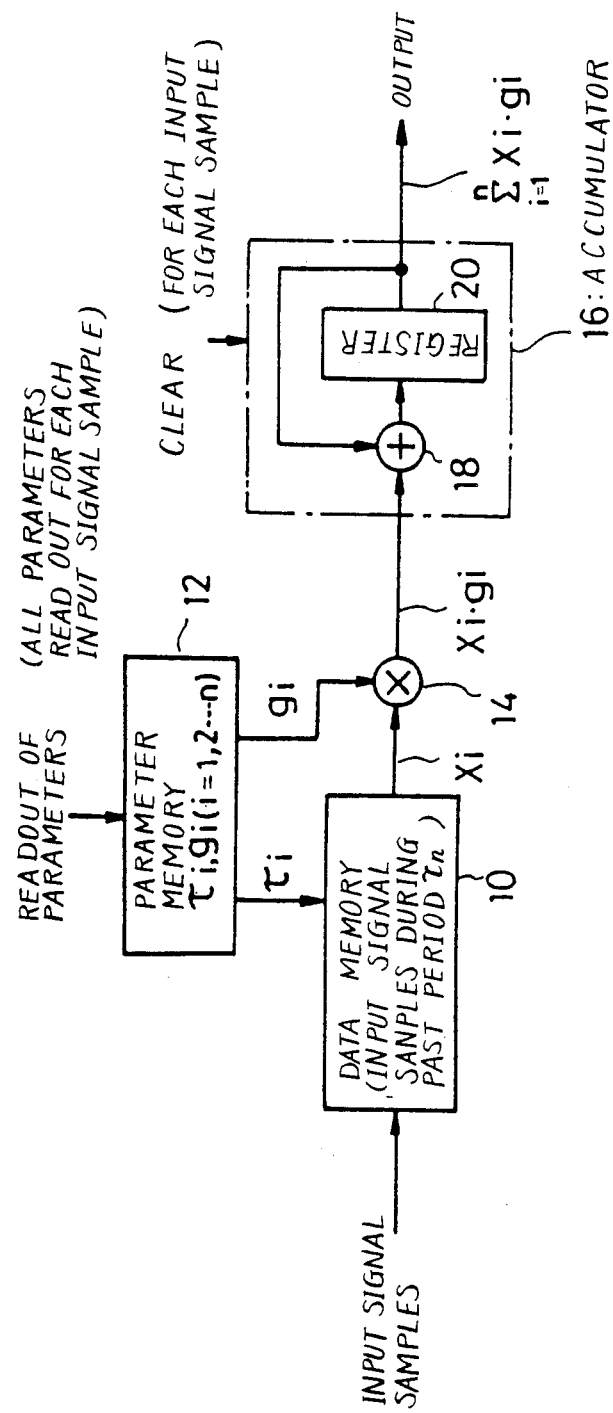
FIG. 3 is a block diagram showing a specific example of the device of FIG. 2.
Figure 4:
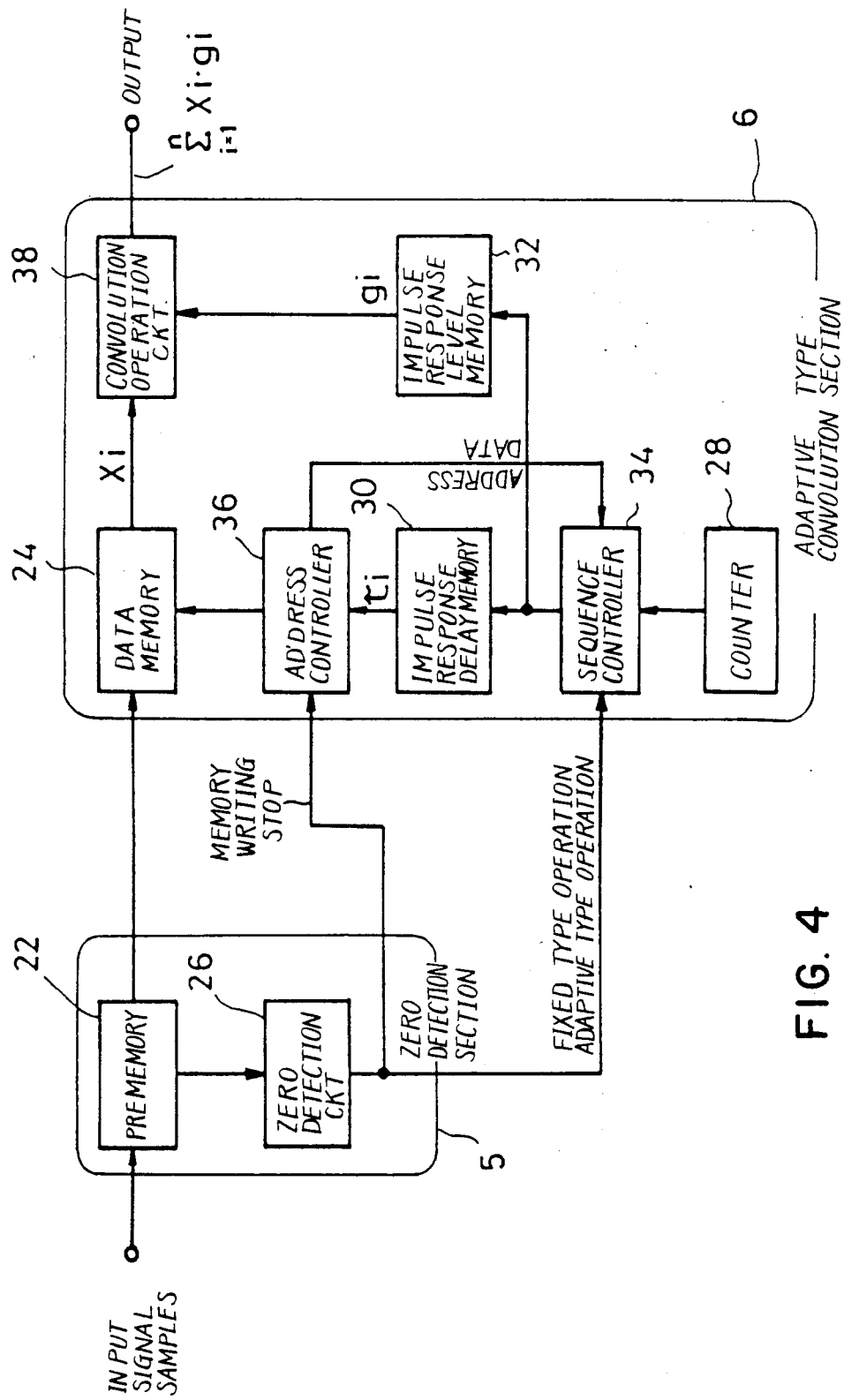
FIG. 4 is a block diagram showing a prior art reverberation imparting device.
Figure 6:
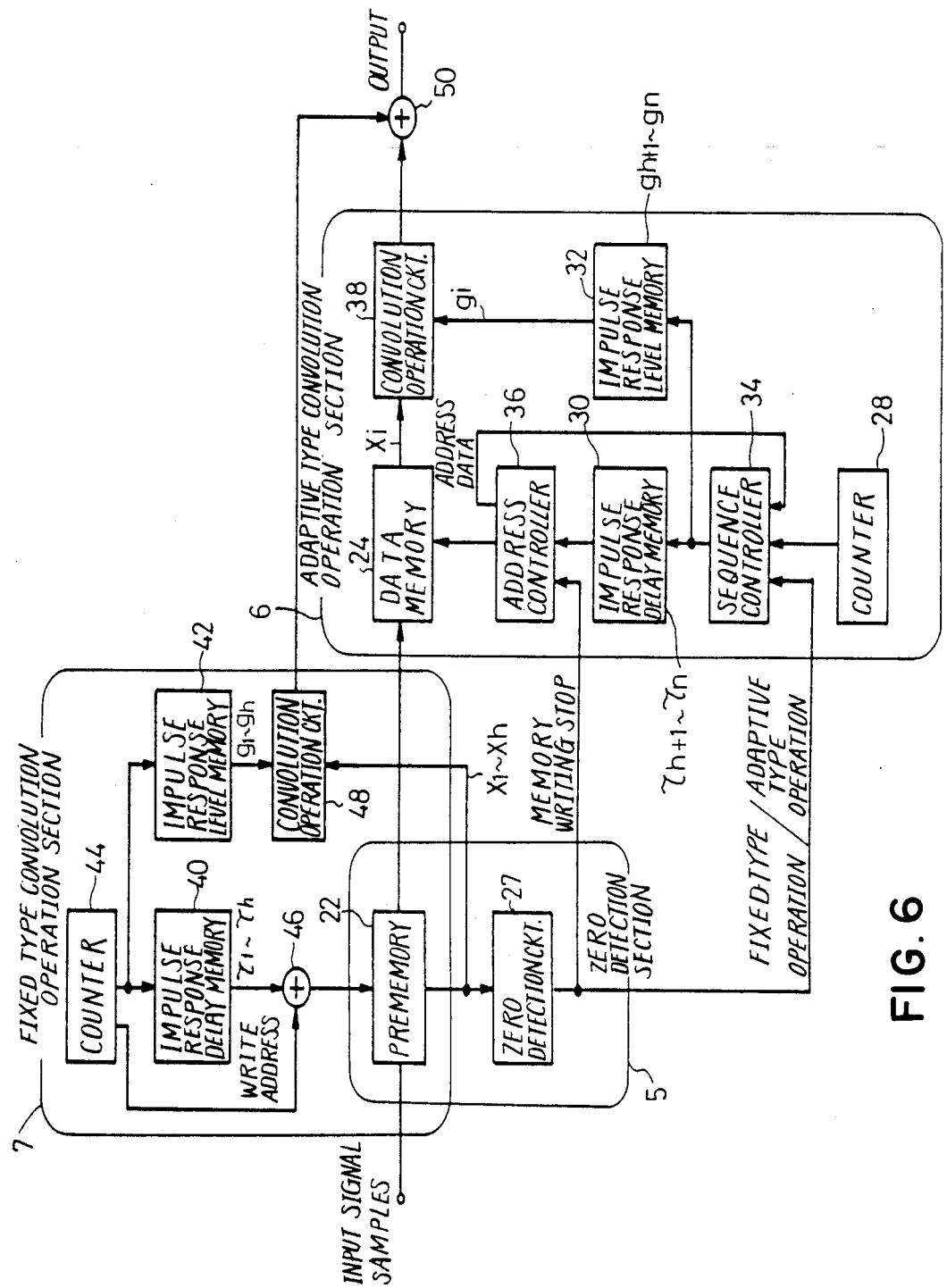
FIG. 6 is a block diagram showing an embodiment of the invention.

FIG. 6 shows an embodiment of the reverberation imparting device designed for preventing the delay in a reverberation sound according to the invention. In FIG. 6, component parts corresponding to those in the prior art device shown in FIG. 4 are designated by the same reference characters. While in the foregoing description of the principle of the invention, the prememory 22 and the data memory 24 are constructed of shift registers, these memories in the present embodiment are constructed of RAMs which have a larger freedom of design and are easier for setting and changing of the parameters.

In the present embodiment, it is assumed that n parameters ($\tau_1$, $g_1$) through ($\tau_n$, $g_n$) are provided among which k parameters are used at a time. Among the k parameters, h parameters of more significant bits ($\tau_1$, $g_1$) through ($\tau_h$, $g_h$) are used for the fixed type operation and k−h parameters among the rest of the parameters ($\tau_{h+1}$, $g_{h+1}$) through ($\tau_n$, $g_n$) are used for the adapted type operation.

In FIG. 6, a zero detection section 5 and an adaptive type convolution operation section 6 are constructed in the same manner as in those of FIG. 4.

A fixed type convolution operation section 7 produces an initial portion of a reverberation signal on the basis of data stored in the prememory 22. More specifically, an impulse response delay memory 40 stores parameters $\tau_1$ to $\tau_h$ for the delay data held in the prememory 22 (parameters of up to several milliseconds) among the delay time parameters $\tau_i$ (i being 1, 2, . . . n). An impulse response level memory 42 stores corresponding level parameters $g_1$ to $g_h$.

A counter 44 is provided for designating read addresses for all parameters for the delay memory 40 and the level memory 42 at each sampling period and also designating a write address and read addresses for the prememory 22. Since the read addresses are located at a time points which are delayed from the write address by $\tau_1$ to $\tau_h$, the read address is provided by adding the delay time parameters $\tau_1$ to $\tau_h$ to the write address by an adder 46.

In a convolution operation circuit 48, input sampled values $x_1$ to $x_h$ corresponding to the delay times $\tau_1$ to $\tau_h$ read out from the prememory 22 are multiplied with the corresponding level parameters $g_1$ to $g_h$ from the impulse response level memory 42 and results of the multiplication are accumulated whereby the convolution operation is performed. In the foregoing manner, one convolution operation is performed at each sampling period of the input signal and the initial portion of the reverberation signal is produced by the fixed type convolution operation section 7.

In the adaptive type convolution operation section 6, delay data provided by the prememory 22 is written into a data memory 24 from an address in which the oldest sampled value is written and the data in each address is sequentially renewed.

An impulse response delay memory 30 stores delay time parameters $\tau_{h+1}$ to $\tau_n$ after the delay time parameters $\tau_1$ to $\tau_h$ for the initial reflected sound portion used in the fixed type convolution operation section 7. An impulse response level memory 32 stores corresponding gain parameters $g_{h+1}$ to $g_n$.

A counter 28 performs a timing control for reading out (k−h) sets of parameters selected by a sequence controller 34 among all parameters from the delay memory 30 and the level memory 32 at each sampling period of the input signal.

The sequence controller 34 determines which of the (k−h) sets of parameters used in the operation section 6 should be selected. When the input signal is continuously applied, (k−h) parameters from the first one ($\tau_{h+1}$, $g_{h+1}$) through ($\tau_k$, $g_k$) are sequentially read out in accordance with the count value of the counter 28.

Upon the zero detection by the zero detection circuit 27, the convolution operation is shifted to the adaptive type operation. In the adaptive type operation, time t from the start of the operation is measured and (k−h) parameters satisfying the relation $t+t_0 \leq \tau_i$ (t being delay time in the prememory 22 and $\tau_h \leq t_0 \leq \tau_{h+1}$) are used.

An address controller 36 designates write address and read addresses for the data memory 24. The address controller 36 has an additional function of sending address information to the sequence controller 34.

Writing in the data memory 24 is suspended during the zero detection and writing is resumed from the suspended address at termination of the zero detection (i.e., when application of the input signal is resumed). This enables the capacity of the data memory 24 to be reduced, for the capacity of the memory 24 need not be one corresponding to all parameters but has only to be one for parameters used for the adaptive type convolution operation.

Figure 13:
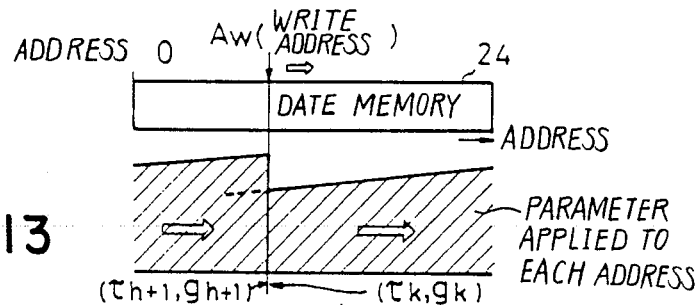
FIGS. 13 through 17 are diagrams showing operations of a data memory 24 in FIG. 6 and parameters used therefor.

The operation of the controller 34 with respect to respective states of the input signal is as follows:

FIG. 13 shows a state in which the input signal is continuously applied. In this state, the first parameter ($\tau_{h+1}$, $g_{h+1}$) through the (k−h)-th parameter ($\tau_k$, $g_k$) counted from the write address $A_w$ are used for data of corresponding addresses.

Figure 14:
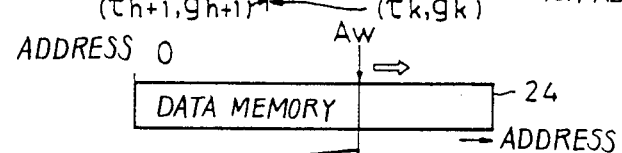

FIG. 14 shows a state in which some time has elapsed from the state of FIG. 13. In this state, the first parameter ($\tau_{h+1}$, $g_{h+1}$) through the (k−h)-th parameter ($\tau_k$, $g_k$) counted from the shifted write address $A_w$ are used for data of corresponding addresses. Upon reaching the final address, the write address $A_w$ returns to the initial address and sequentially renew data.

Figure 15:
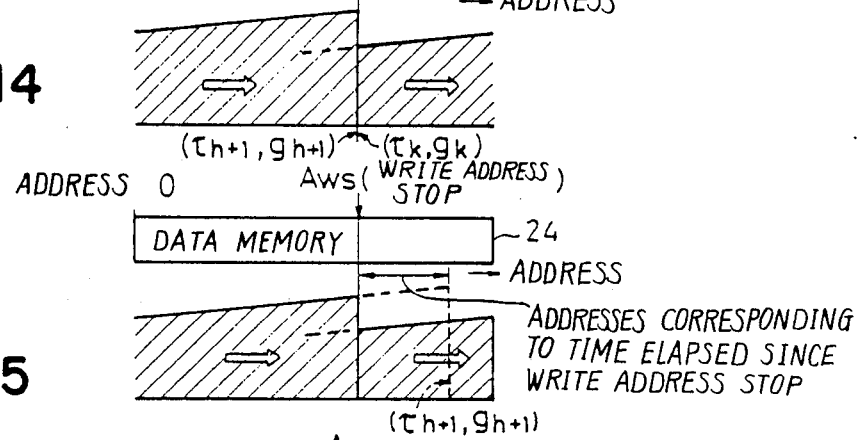

FIG. 15 shows a state in which the input signal has been interrupted. The write address $A_w$ stops and writing is prohibited. During this state, the parameters are sequentially shifted to less significant bits at each sampling period and used for data of corresponding addresses.

Figure 16:
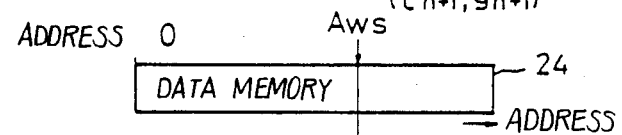

FIG. 16 shows a state in which the input signal has long been interrupted. In this state, parameters have been shifted to the vicinity of the least significant bit. If time further elapses in this state, there are no more parameters available for use so that the reverberation sound dies away.

Figure 17:
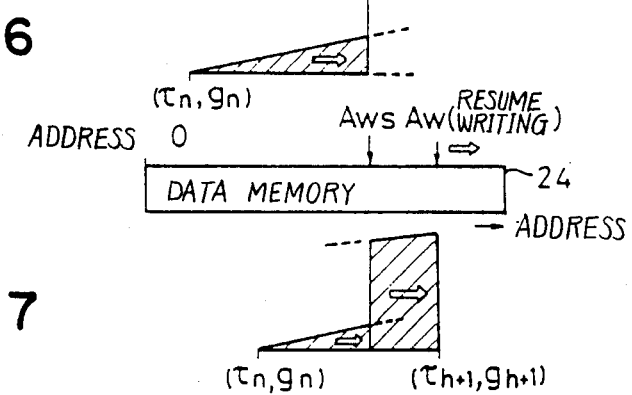

FIG. 17 shows a state in which application of the input signal has been resumed after the interruption thereof. The write address $A_w$ starts to be shifted from the suspended write address $A_{ws}$ at each sampling period. As to the parameters, the first parameter counted from the new write address $A_w$ through a parameter at the suspended write address $A_{ws}$ are used. If there is any parameter to be used for data before the interruption of the input signal, such parameter also is used for corresponding data.

The convolution operation circuit 38 sequentially multiplies delay signal data $x_i$ from the data memory 24 with corresponding level parameter $g_i$ from the impulse response level memory 32 and accumulates results of the multiplication to produce one sampled value of the reverberation signal. By repeating of this operation, sampled values of a portion after the initial portion of the reverberation signal are produced.

The initial portion of the reverberation signal produced by the fixed type convolution operation section 7 and the subsequent portion thereof produced by the adaptive type convolution operation section 6 are added together in an adder 50 and a sum signal is provided from the adder 50.

Figure 5:
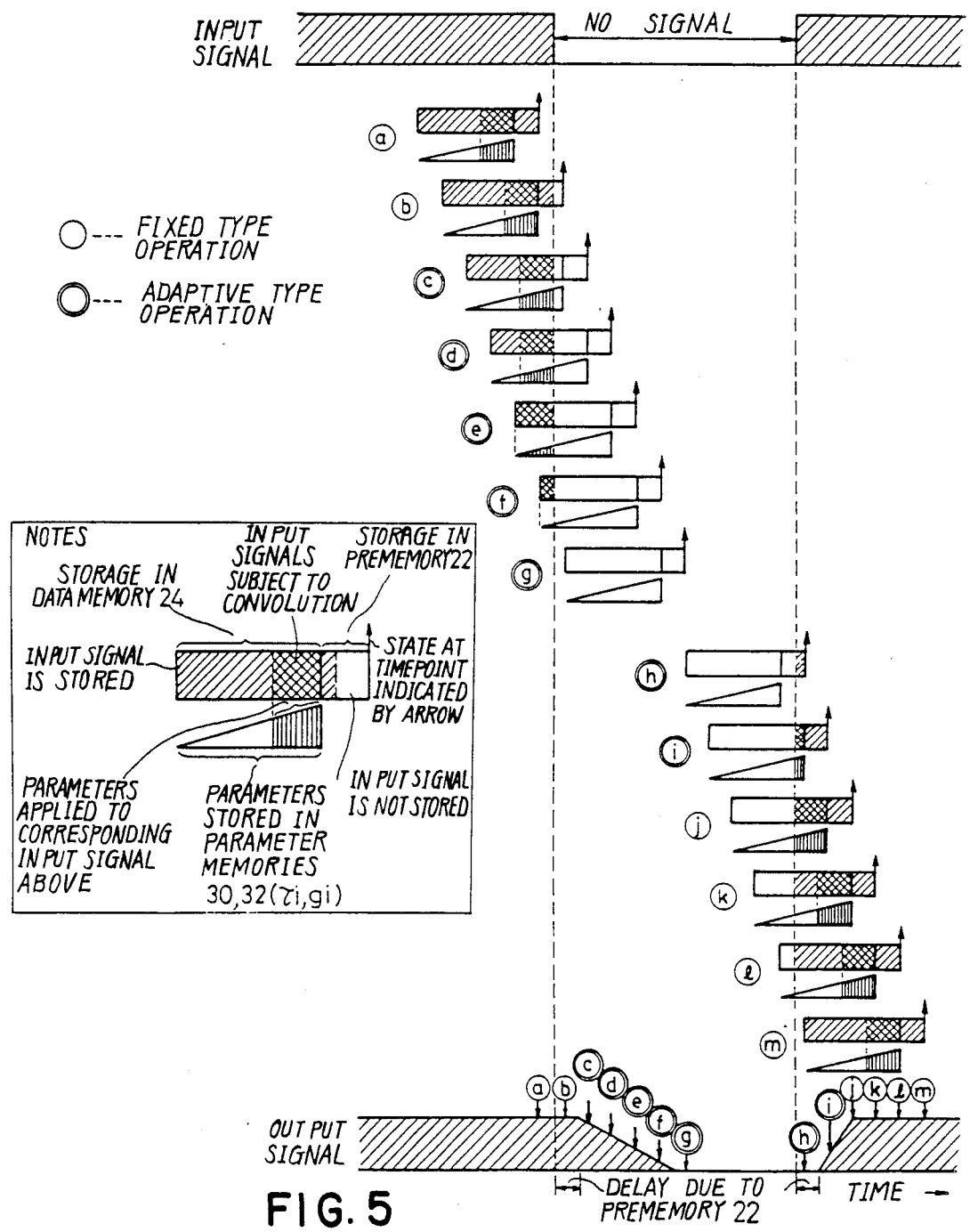
FIG. 5 is a view for explaining the operation of the device of FIG. 4.
Figure 18:
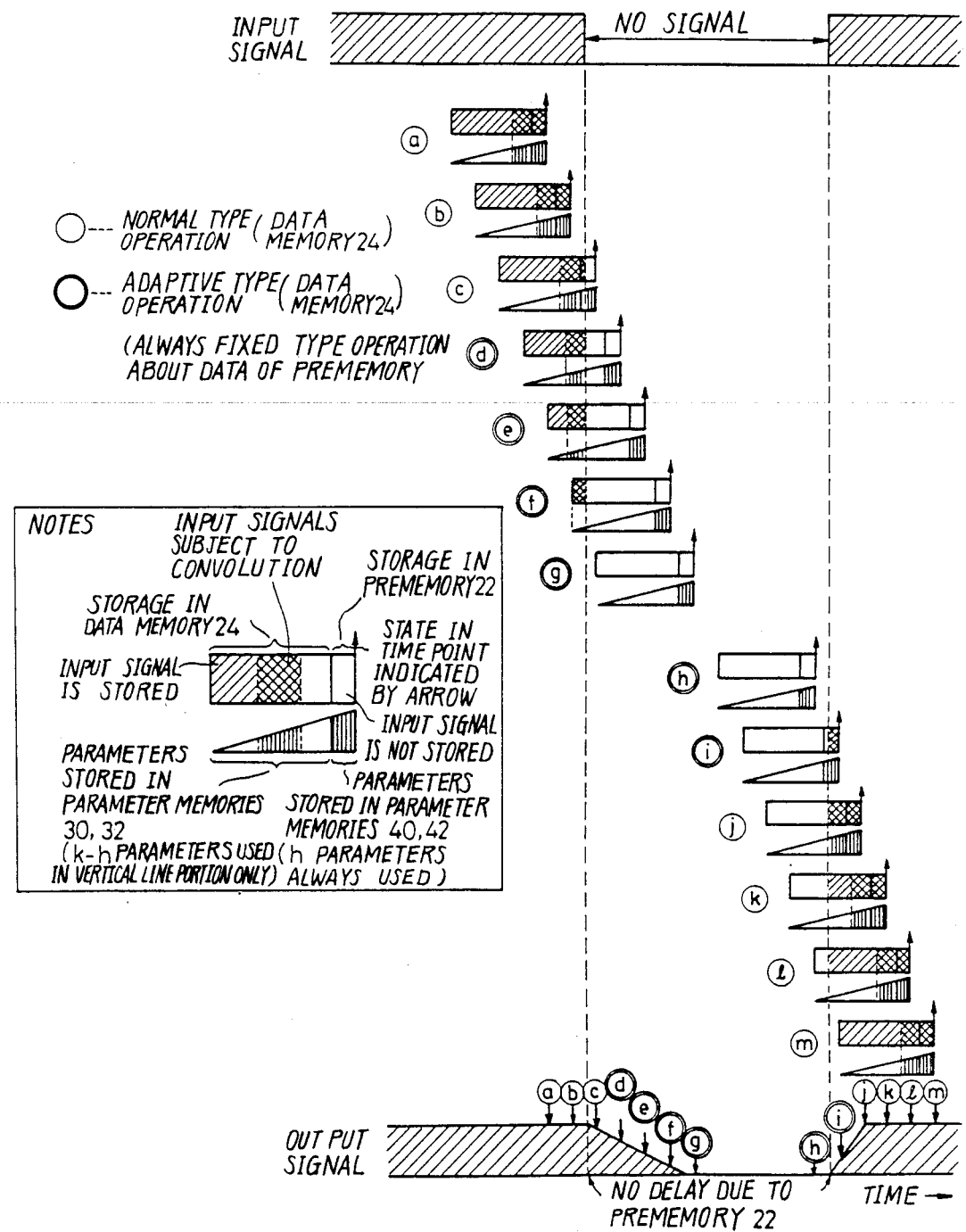
FIG. 18 is a diagram for explaining operation of the device of FIG. 6.

FIG. 18 shows the operation of the reverberation imparting device of FIG. 6 in the sequence of a through m steps. The manner of indication of the respective states is the same as that employed in FIG. 5.

The reverberation signal obtained by adding the output of the fixed type convolution operation section 7 and the output of the adaptive type convolution operation section 6 is shown at the bottom of FIG. 18. It will be understood from the figure that there is no delay between the input signal and the output signal. Accordingly, no undue delay of a reverberation sound relative to a direct sound is produced and a natural reverberation sound can be obtained not only in playback of a record but also in the live vocal performance or live musical instrument performance.

Figure 19:
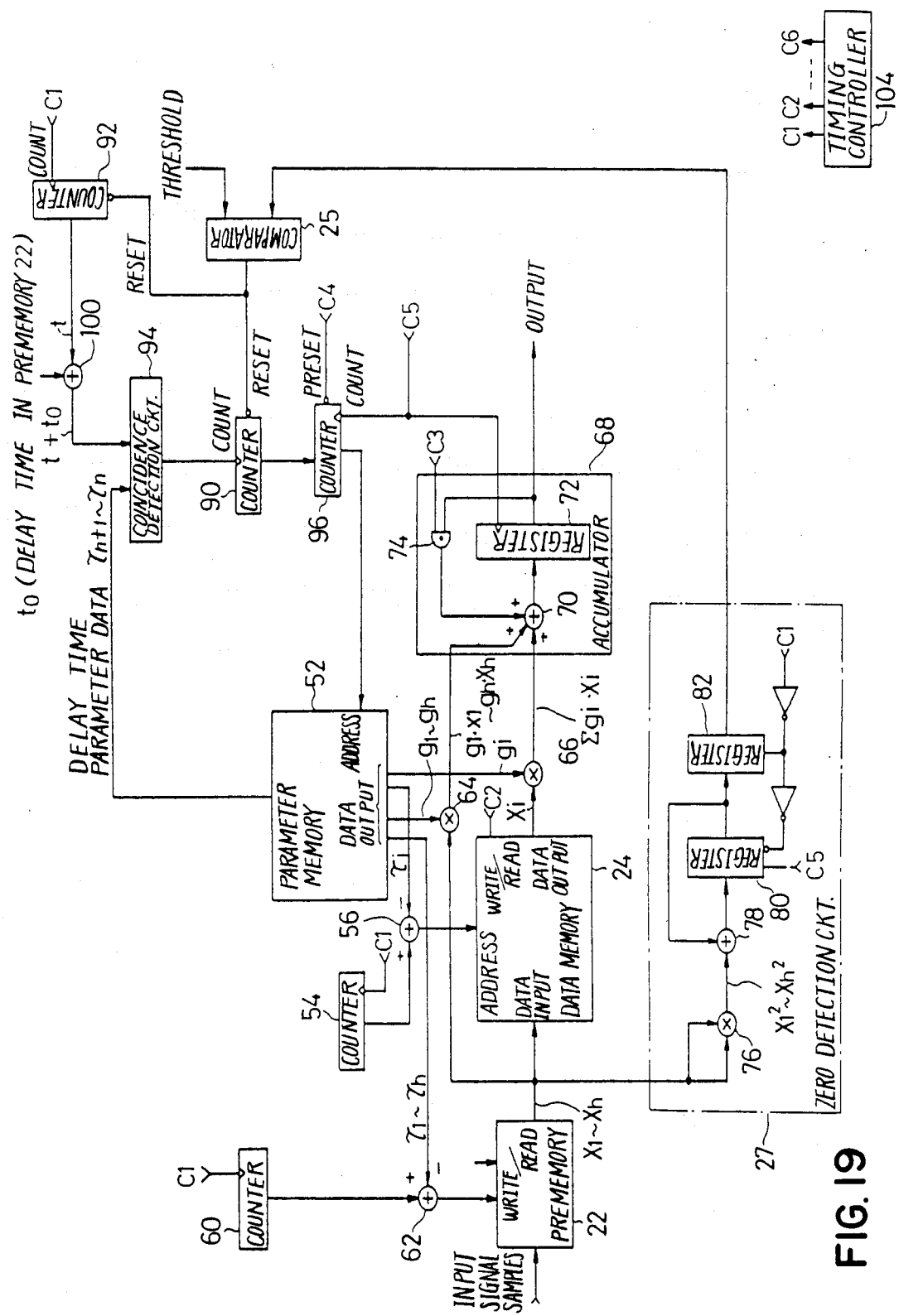
FIG. 19 is a block diagram showing a specific example of the device of FIG. 6.

A specific example of the embodiment of FIG. 6 is shown in FIG. 19. In FIG. 19, a parameter memory 52 stores fixed type operation parameters $(\tau_1, g_1)$ through $(\tau_h, g_h)$ and adaptive type operation parameters $(\tau_{h+1}, g_{h+1})$ through $(\tau_n, g_n)$.

A counter 60 is provided for giving the write address to the prememory 22 and is incremented by the clock C1 at each sampling period $\tau_0$. A subtractor 62 calculates the address for the delay time $\tau_1, \ldots \tau_h$ for the present write address and supplies this address as the read address to the prememory 22. The prememory 22 is switched to the write mode by clock C6 once every period $\tau_0$. At this time, the delay time parameter from the parameter memory 52 is 0 so that the count value of the counter 60 is delivered out of the subtractor 62 and a sampled value of the input signal is written at the address of the prememory 22 corresponding to this count value. At timings other than the clock C6, the prememory 22 is in the read mode in which sampled values of the input signal with the delay times of $\tau_1$ to $\tau_h$ from the write address are sequentially read out in accordance with the delay time parameters $\tau_1$ to $\tau_h$ provided sequentially from the parameter memory 52 within the period $\tau_0$.

A counter 54 is provided for giving the write address to the data memory 24 and is incremented by the clock C1 at each period $\tau_0$. A subtractor 56 calculates the address of the delay time $\tau_i$ for the present write address and supplies this address as the read address to the data memory 24. The data memory 24 is switched to the write mode by the clock C2 once every period $\tau_0$. At this time, the delay time parameter is 0 and the count value of the counter 54 is delivered out from the subtractor 56 and the output of the prememory 22 is written at the address of the data memory 24 corresponding to this count value. At this time, a next write address (the oldest data address) is designated in the prememory 22 by the counter 60 so that data written in the data memory 24 is one delayed by the capacity of the prememory 22.

At timings other than the clock C2, the data memory 24 is switched to the read mode in which data of the delay time $\tau_i$ from the write address is sequentially read out in accordance with the delay time parameter $\tau_i$ provided sequentially from the parameter memory 52 within the period $\tau_0$.

Data $x_1$ to $x_h$ sequentially read out from the prememory 22 is multiplied in a multiplier 64 with the level parameters $g_1$ to $g_h$ sequentially provided from the parameter memory 52 and results of the multiplication $g_1 \cdot x_1$ through $g_h \cdot x_h$ are sequentially provided from the multiplier 64.

Data $x_i$ sequentially read out from the data memory 24 is multiplied in a multiplier 66 with the level parameters $g_i$ sequentially provided from the parameter memory 52 and results of the multiplication $g_i \cdot x_i$ is sequentially provided from the multiplier 66.

An accumulator 68 accumulates the results of the multiplication in the multipliers 64 and 66 by an adder 70 and a register 72. The accumulator 68 thereby ultimately provides an accumulated value of all results of multiplication within the period $\tau_0$. Contents of the register 72 are reset by clock C3 after completion of this accumulation.

The zero detection circuit 26 squares the outputs $X_1$ through $X_h$ of the prememory 22 by a multiplier 76 to obtain $X_1^2$ through $X_h^2$, accumulates these values by an adder 78 and a register 80 and transfers an accumulated value within the period $\tau_0$ to a register 82 by the clock C1. The register 80 is reset at each period $\tau_0$ by the clock C1.

An example of write addresses for the adaptive type operation parameter is shown in the following Table 1.

The delay time parameter $\tau_i$ is conveniently stored in the form of multiples of one sampling period $\tau_0$ of the input signal. It is possible to store this parameter in the real time form but in that case an additional interface construction for matching timing in the circuit will be required.

TABLE 1

| address | delay time parameter | level parameter |
| --- | --- | --- |
| 0 | 0 | 0 |

TABLE 1-continued

| address | delay time parameter | level parameter |
|---------|---------------------|-----------------|
| 1 | $\tau_{h+1}$ | $g_{h+1}$ |
| 2 | $\tau_{h+2}$ | $g_{h+2}$ |
| . | . | . |
| . | . | . |
| . | . | . |
| n − h | $\tau_n$ | $g_n$ |

Since the address for the adaptive type operation parameter cannot be used commonly for the address for the fixed type operation parameter (in the adaptive type operation, all of the parameters ($\tau_{h+1}$, $g_{h+1}$) through ($\tau_n$, $g_n$) are not read out by a single convolution so that there will occur a state in which a parameter necessary for the fixed type operation is not read out if a common address is employed), an address and a readout signal proper to the fixed type operation are used. In this case, the following conditions should be satisfied:

(a) All of the parameters ($\tau_1$, $g_1$) through ($\tau_h$, $g_h$) should be read out within the period $\tau_0$ (there is no particular order).

(b) Readout should be made in synchronism with the readout of the parameters of the adaptive type operation as the convolution is made simultaneously with the adaptive type operation in the accumulator 68.

(c) The delay time parameter at the time of writing input data in the prememory 22 should be 0 (for writing the input data at the address of the prememory 22 designated by the counter 60).

For this purpose, for instance, the clock C5 generated after start of the sampling period $\tau_0$ may be counted and the fixed type operation parameter may be read out using the count value of the clock C5 as the address. An example of reading in this manner is shown in the following Table 2.

In this case also, the delay time parameter $\tau_i$ is stored in the form of multiples of the sampling period.

TABLE 2

| Address (counts of clock C5 from start of sampling period) | Delay time parameter for fixed type convolution | Level parameter for fixed type convolution |
|---|---|---|
| 1 | 0 | 0 |
| 2 | 0 | 0 |
| 3 | $\tau_1$ | $g_1$ |
| 4 | $\tau_2$ | $g_2$ |
| . | . | . |
| . | . | . |
| . | . | . |
| h + 2 | $\tau_h$ | $g_h$ |

Reading of the adaptive type parameter is performed in the following manner.

When the output of the zero detection circuit 27 is larger than a predetermined threshold value (i.e., when the input signal is maintained), the comparator 25 clears counters 90 and 92. The counter 90 establishes the initial value of the adaptive type operation parameter data and contents of the counter 90 are "1" when the counter 90 is reset and are the output count of a coincidence detection circuit 94 when it is released from the reset state.

The counter 96 is provided for designating the read address. The counter 96 is reset by a clock C4 which is produced once each period $\tau_0$, causes the count of the counter 90 to become its initial value at a next clock C5 (see FIG. 20) and subsequently counts the clock C5 to provide (k−h) read addresses necessary for the adaptive type operation within the period $\tau_0$. When the count of the counter 90 is "1" (i.e., when the input signal is maintained), the counter 96 is preset to "1" and the address in the parameter memory 52 is sequentially designated from the address 1.

The counter 92 is released from the reset state by the zero detection and thereafter counts clock C1. This count value corresponds to the number of samples after shifting to the adaptive type operation and represents the time t elapsed after shifting to the adaptive type operation. This time t is added to the delay time $t_0$ in the prememory 22 by an adder 100 and time (t+$t_0$) is provided from the adder 100. This time (t+$t_0$) represents time elapsed from interruption of the input signal.

The coincidence detection circuit 94 compares the delay time parameters $\tau_{h+1}$ to $\tau_n$ for the adaptive type operation with the time (t+$t_0$) and outputs a pulse each time they coincide with each other. The counter 90 counts this pulse. Since parameters for delay time after the time (t+$t_0$) elapsed after interruption of the input signal are used in the adaptive type operation (because input signal data corresponding to delay time prior to the time (t+$t_0$) (i.e., shorter than t) has become 0 due to the interruption of the input signal so that there is not sense in using this data in the convolution operation), the output pulse of the coincidence detection circuit 94 is counted by the counter 90 for knowing how many parameters have elapsed from the interruption of the input signal and thereby determining from which order of parameter should be applied to the convolution.

The count of the counter 96 whose initial value is the count of the counter 90 and which thereafter is constituted by counting the clock C5 is applied to the parameter memory 52 as a read address and a corresponding parameter thereby is read out from the memory 52.

A timing controller 104 in FIG. 19 produces control signals for operating the respective circuits.

Figure 20:
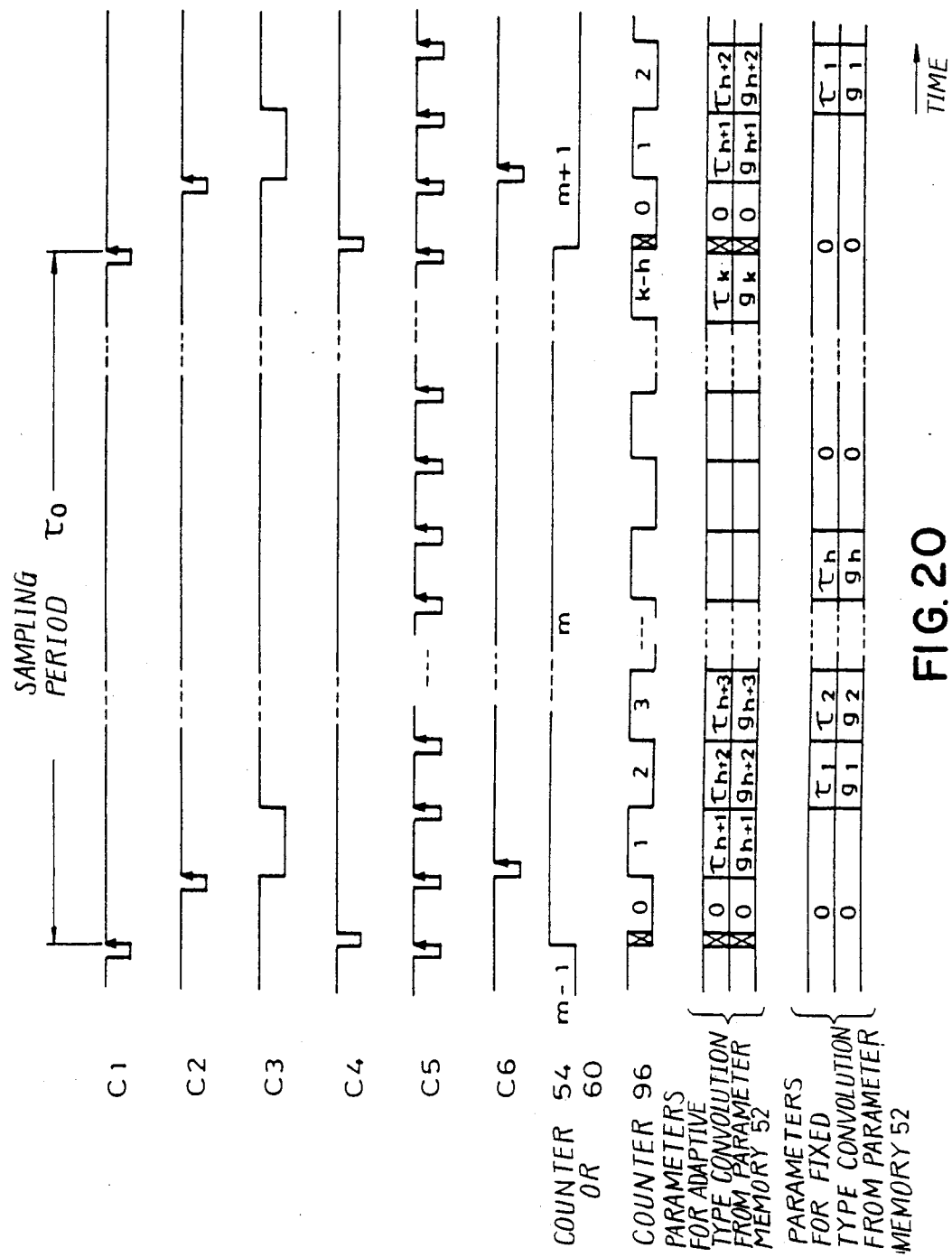
FIG. 20 is a diagram for explaining operation of the device of FIG. 19.

An example of operation of the circuit of FIG. 19 is shown in FIG. 20. This operation is one in the state in which it has not been shifted to the adaptive type operation.

One sampling period $\tau_0$ is started at clock C1. This clock C1 is counted by the counters 54 and 60 and the write address is shifted one by one. The delay time parameter is initially 0 both in the prememory 22 and the data memory 24 and, accordingly, counts of the counters 54 and 60 are directly applied to the data memory 24 and the prememory 22 as the address signals. In the data memory 24, writing of data is made in accordance with clock C2. At this time, in the prememory 22, the counter 60 designates the address at which the data should be written next and the data at this address is transferred to the data memory 24 in accordance with the clock C2. In the prememory 22, new data is subsequently written in accordance with clock C6.

The fixed type operation parameters and the adaptive type operation parameters are sequentially read out from the parameter memory 52 at a period of clock C5. The adaptive type operation parameters are all read out within one sampling period. The fixed type operation parameters which are smaller in number than the adaptive type operation parameters are all read out in an early portion of one sampling period and thereafter 0 is read out in the rest of the sampling period.

Since the state prior to starting of the adaptive type operation is shown in FIG. 20, the initial value of the counter 96 is 1 (0 before this state represents a reset state) and the adaptive type operation parameters are read out from the first one in the order of $(\tau_{h+1}, g_{h+1})$ through $(\tau_k, g_k)$. Upon starting of the adaptive type operation, the initial value of the counter 96 sequentially changes in the order of 2, 3, ... and the parameter is sequentially changed accordingly. The fixed type operation parameter remains unchanged.

By accumulating the adaptive type operation values and the fixed type operation values, a final accumulated value is obtained at the end of each sampling period $\tau_0$ and this value constitutes one sample of the reverberation signal. By repeating this operation for each sampling period $\tau_0$, a series of reverberation signals are obtained.

Figure 21:
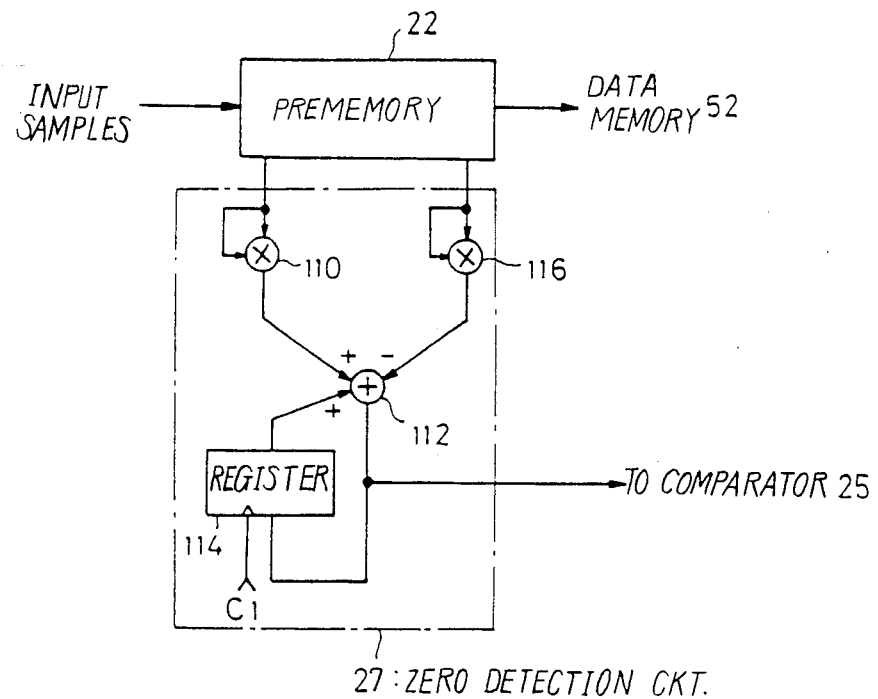
FIG. 21 is a circuit diagram showing another example of a zero detection circuit 26.

Another example of the zero detection circuit 27 is shown in FIG. 21. In this circuit, the newest data in the prememory 22 is squared by a multiplier 110, the result of the multiplication is held by a register 114 through an adder 112 in accordance with clock C1, the value of the register 114 is accumulated by the adder 112, the oldest data in the prememory 22 is squared by a multiplier 116 and the result of this multiplication is subtracted from the accumulated value by the adder 112 and a sum of all data stored in the prememory 22 which has been squared is held by the register 114.

Embodiments of the reverberation imparting device according to the invention capable of timewise controlling frequency characteristics of the reverberation sound will be described below.

Figure 22:
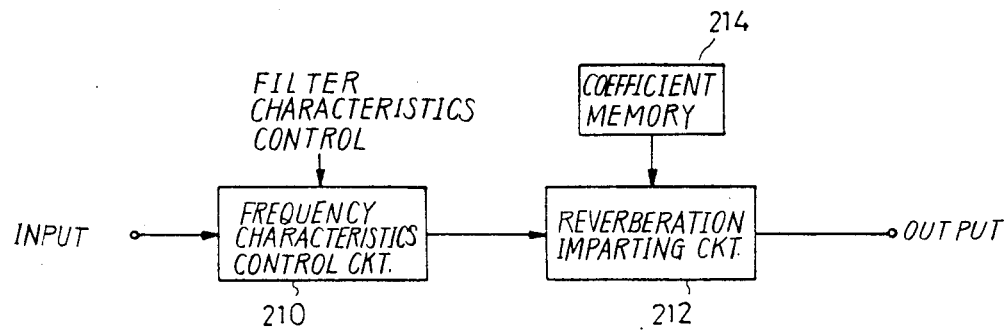
FIG. 22 is a block diagram showing an embodiment of the invention capable of timewise controlling frequency characteristics of a reverberation sound.

FIG. 22 shows one of such embodiments. According to this embodiment, frequency characteristics are imparted to input data before preparation of a reverberation signal.

In FIG. 22, an input signal is imparted with filter characteristics in a frequency characteristics control circuit 210. The frequency characteristics are timewise variably controlled. The output of the frequency characteristics control circuit 210 is applied to a reverberation imparting circuit 212. The reverberation imparting circuit 212 produces a reverberation signal with respect to each sample of the input signal in accordance with impulse response parameters (parameters concerning delay time and level) stored in a coefficient memory 14 and produces a series of reverberation signals by adding reverberation signals for the respective samples by means of the convolution operation. By timewise variably controlling the filter characteristics of the fequency characteristics control circuit 210, a reverberation signal imparted with the timewise varying filter characteristics is delivered out of the reverberation imparting circuit 212.

Figure 23:
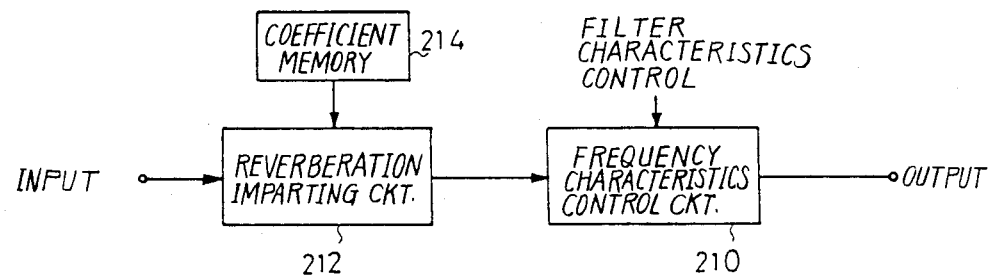
FIG. 23 is a block diagram showing another embodiment of the invention.

Another embodiment of the reverberation imparting device according to the invention is shown in FIG. 23. According to this embodiment, filter characteristics are imparted to data after preparing the reverberation signal.

In FIG. 23, an input signal is applied to a reverberation imparting circuit 212. The reverberation imparting circuit 212 produces a reverberation signal with respect to each sample of the input signal in accordance with coefficient parameters of impulse response stored in a coefficient memory 214 and produces a series of reverberation signals by adding these reverberation signals by means of the convolution operation. The reverberation signal provided by the reverberation imparting circuit 212 is imparted with filter characteristics in a frequency characteristics control circuit 210. The filter characteristics are timewise variably controlled.

Figure 24:
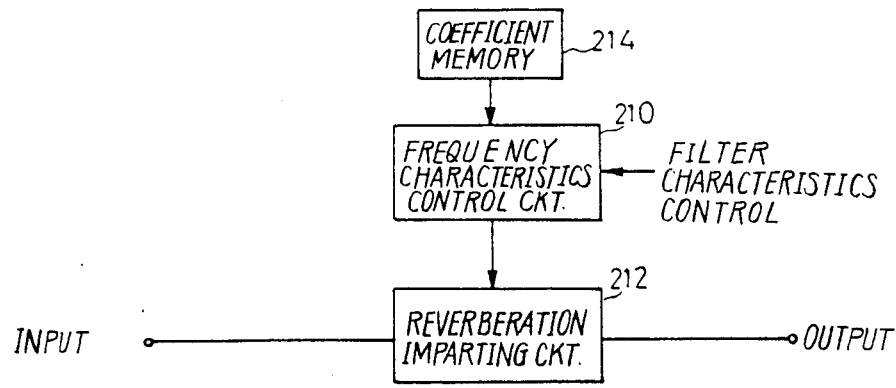
FIG. 24 is a block diagram showing still another embodiment of the invention.

A still another embodiment of the reverberation imparting device according to the invention is shown in FIG. 24. According to this embodiment, the coefficient parameters of impulse response for producing a reverberation signal is imparted with filter characteristics.

In FIG. 24, the coefficient parameters of impulse response stored in a coefficient memory 214 are imparted with filter characteristics in a frequency characteristics control circuit 210. A reverberation imparting circuit 212 produces a reverberation signal with respect to each sample of an input signal in accordance with the coefficient parameters imparted with the filter characteristics and produces a series of reverberation signals by adding these reverberation signals by the convolution operation.

Since the pattern of the impulse response and the filter characteristics occur synchronously, by changing the pattern of the impulse response in shape by passing it through the frequency characteristics control circuit 210 and performing the convolution operation using this changed impulse response, a reverberation signal imparted with such filter characteristics can be derived.

According to the embodiments shown in FIGS. 22, 23 and 24, in the case when the input signal has been interrupted, the band of the filter characteristics of the frequency characteristics control circuit 210 can be narrowed towards the low frequency region in accordance with attenuation of the reverberation signal whereby the high frequency region can be sooner attenuated than the low frequency region so that natural reverberation sound can be closely simulated. Besides, these embodiments can be utilized for imparting special effects other than reverberation.

Figure 25:
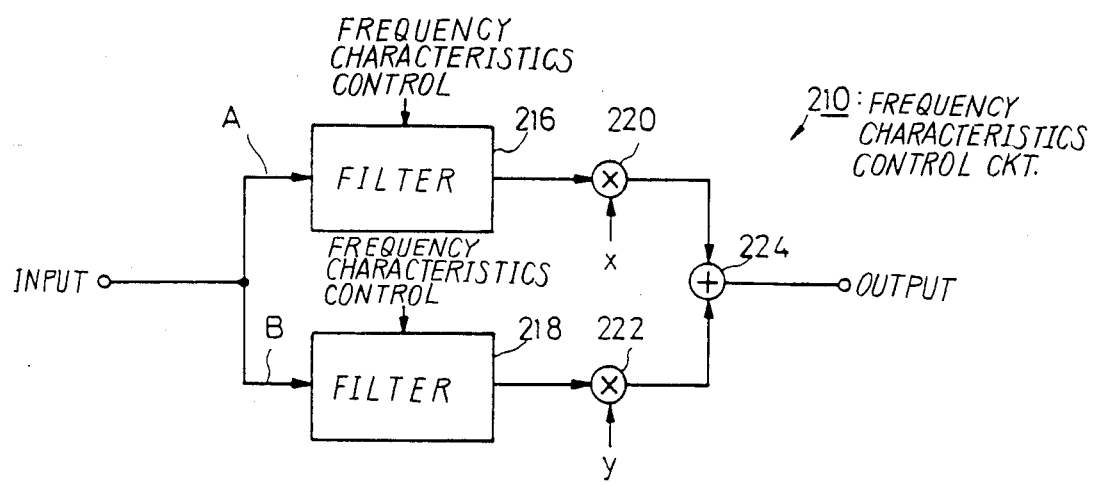
FIG. 25 is a circuit diagram showing an example of a frequency characteristics control circuit 210 in the devices of FIGS. 22, 23 and 24.

An example of construction of the frequency characteristics control circuit 210 employed in these embodiments is shown in FIG. 25. In this example, filter circuits of two channels with different frequency characteristics are provided and the frequency characteristics are gradually changed by crossfading the filter characteristics of these filter circuits.

Figure 26:
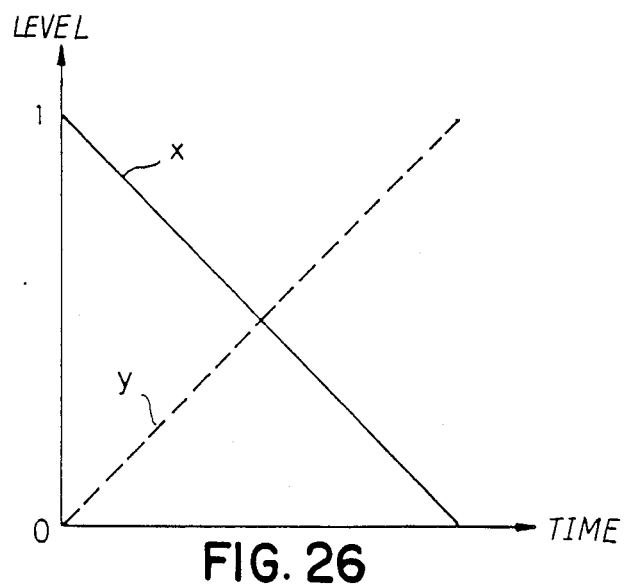
FIG. 26 is a graphical diagram showing timewise change of crossfading coefficients x and y of FIG. 25.

In FIG. 25, the input signal is branched to two channels A and B and applied respectively to filters 216 and 218. The frequency characteristics of the filters 216 and 218 are set independently from each other. The outputs of the filters 216 and 218 are multiplied with crossfading coefficients x and y in multipliers 220 and 222 respectively and added together in an adder 224. The coefficients x and y are determined in such a manner that, as shown in FIG. 26, while the coefficient x changes from 1 to 0, the coefficient y changes from 0 to 1. Accordingly, the filter characteristics of the filter 216 initially is effective and, as time elapses, the filter characteristics of the filter 216 are gradually attenuated while the filter characteristics of the filter 218 gradually become more predominant and finally the filter characteristics of the filter 218 only remain. Thus, the frequency characteristics are continuously changed. Assuming, for example, that the filters 216 and 218 both consist of low-pass filters, the cut-off frequency of the filter 216 is set at a high frequency f1 and the cut-off frequency of the filter 218 at a low frequency f2, frequency characteristics whose cut-off frequency gradually changes from f1 to f2 are obtained.

Further, by continuously changing the frequency characteristics relatively for a long time, the frequency characteristics of the control circuit 210 can be changed over a wide range.

Figure 27:
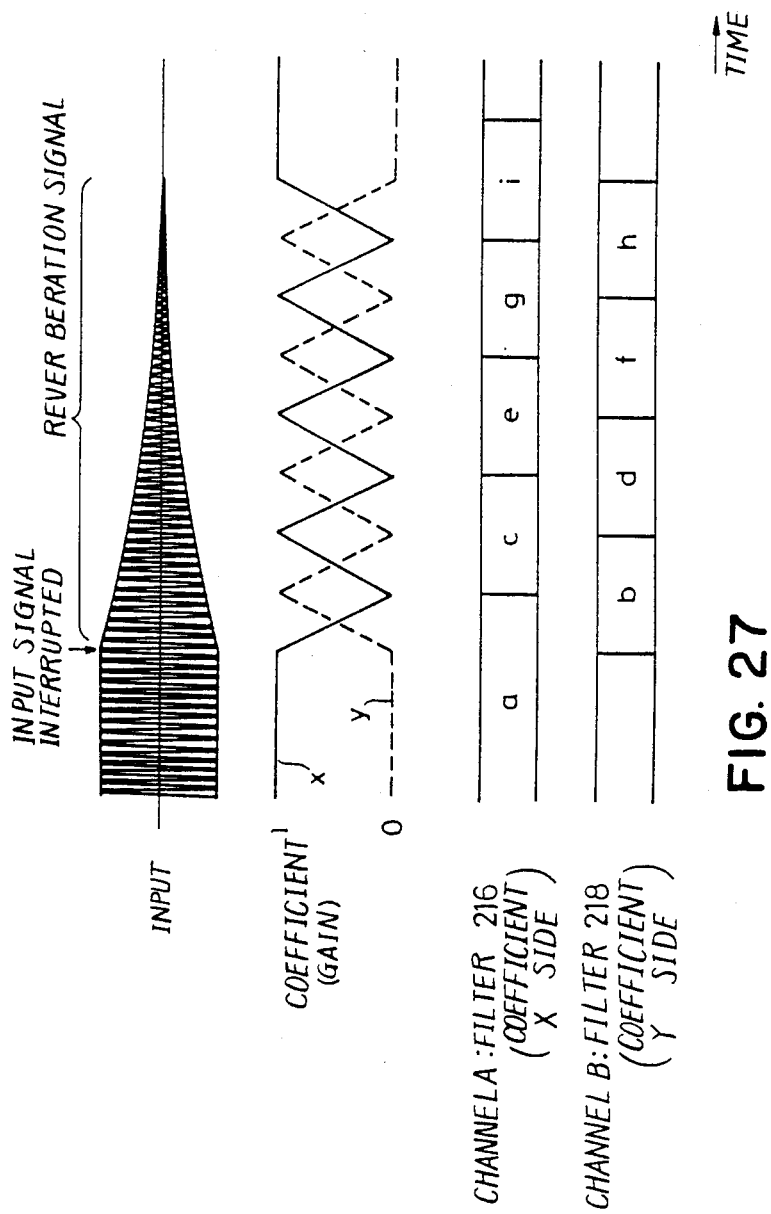
FIG. 27 is a time chart showing states in which filter characteristics applied to an attenuating reverberation signal are sequentially changed by using the frequency characteristics control circuit 210.
Figure 28:
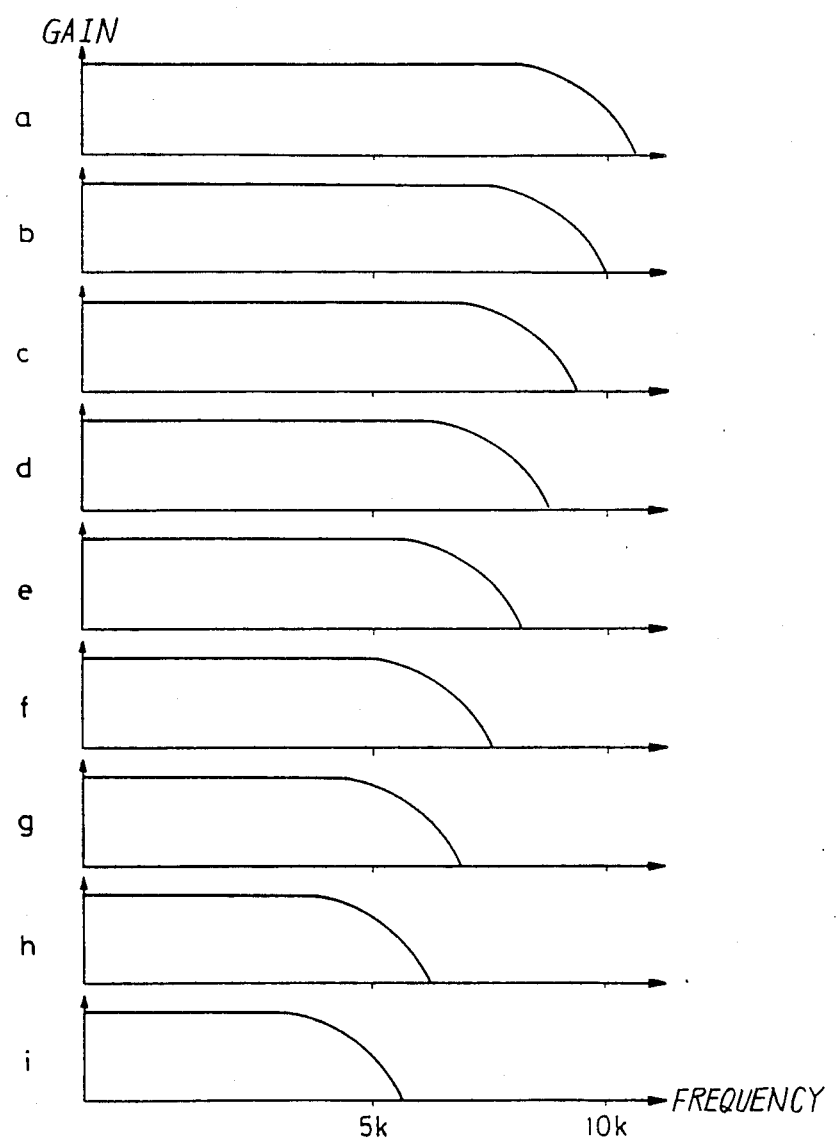
FIG. 28 is a graphical diagram showing filter characteristics used in the operation of FIG. 27.

FIG. 27 shows one such example. This time chart shows a state in which the filter characteristics are alternately changed when the input signal has been interrupted and the reverberation signal therefore is gradually attenuated. In this case, filter characteristics as shown by a through i in FIG. 28 are employed. As shown in FIG. 27, the coefficients x and y change continuously and periodically between 1 and 0, maintaining the mutually inverted relationship between them (i.e., x+y=1). As shown in FIG. 27, the same filter characteristics are continuously used while the coefficient changes from 0 to 1 to 0 and, upon attenuation of the coefficient to 0, the filter characteristics are changed to next one. In the example of FIG. 27, when the input signal is continued, the coefficients are x=1 and y=0 so that the characteristics of the filter 216 of the channel A are effective and set at the filter characteristics a at which the cut-off frequency is at the highest. When the input signal has been interrupted, the value of the coefficient x of the A channel is gradually attenuated from 1 to 0 with the filter characteristics remain to be a whereas the value of the coefficient y of the B channel is gradually increased from 0 to 1 with the filter characteristics are set to b which is lower in the cut-off frequency than a. As the coefficient x becomes 0, the filter characteristics of the A channel is changed to c which is lower in the cut-off frequency than b. Thus, by changing the filter characteristics to those of a lower cut-off frequency in the order of a, b, c, d, . . . , i each time the coefficients x, y become 0 alternately in the A and B channels, the reverberation signal can closely simulate characteristics of a natural reverberation sound in which high frequency components are attenuated relatively soon and low frequency components remain for a long time.

Figure 29:
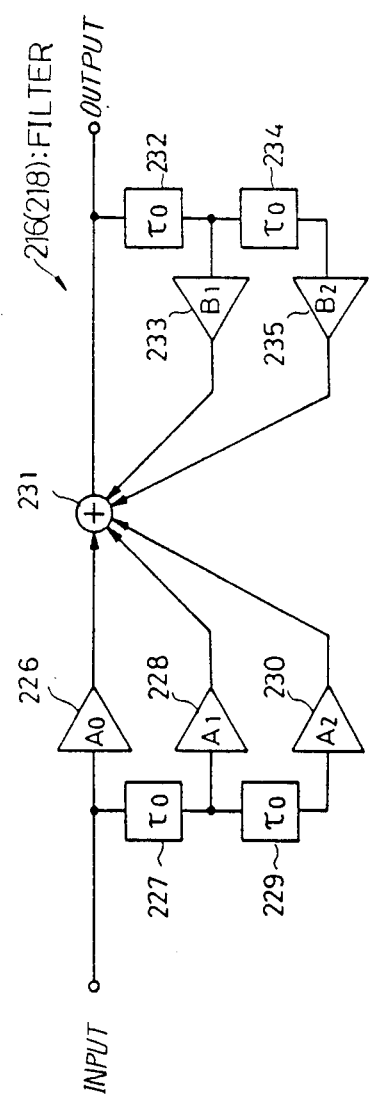
FIG. 29 is a circuit diagram showing an example in which the filters 216 and 218 of FIG. 25 are constructed of circulating type filters.

The filters 216 and 218 can be constructed of digital filters such as an FIR (finite impulse response) filter which is a non-circulating type filter or an IIR (infinite impulse response) filter which is a circulating type filter. An example of the filter 216 or 218 constructed of a secondary IIR filter is shown in FIG. 29. In this filter, a signal derived by providing a coefficient (gain) $A_0$ to an input signal by a multiplier 226, a signal derived by delaying the input signal by one sampling period $\tau_0$ by a delay element 227 and thereafter providing a coefficient $A_1$ by a multiplier 228 and a signal derived by delaying the input signal by two sampling periods $2\tau_0$ by delay elements 227 and 229 and thereafter providing a coefficient $A_2$ are added together by an adder 231. A signal derived by delaying the output of the adder 231 by one sampling period $\tau_0$ by a delay element 232 and thereafter providing a coefficient $B_1$ by a multiplier 233 and a signal derived by delaying the output of the adder 231 by two sampling periods $2\tau_0$ by delay elements 232 and 234 and thereafter providing a coefficient $B_2$ by a multiplier 235 are fed back to the adder 231. In this circuit, the following transmission function $H_{(Z)}$ is obtained:

$$H_{(Z)} = \frac{\text{output}}{\text{input}} = \frac{A_0 + A_1 Z^{-1} + A_2 Z^{-2}}{1 - B_1 Z^{-1} - B_2 Z^{-2}}$$

The filter characteristics can be determined as desired by suitably selecting the values of the coefficients $A_0$, $A_1$, $A_2$, $B_1$ and $B_2$.

Figure 30:
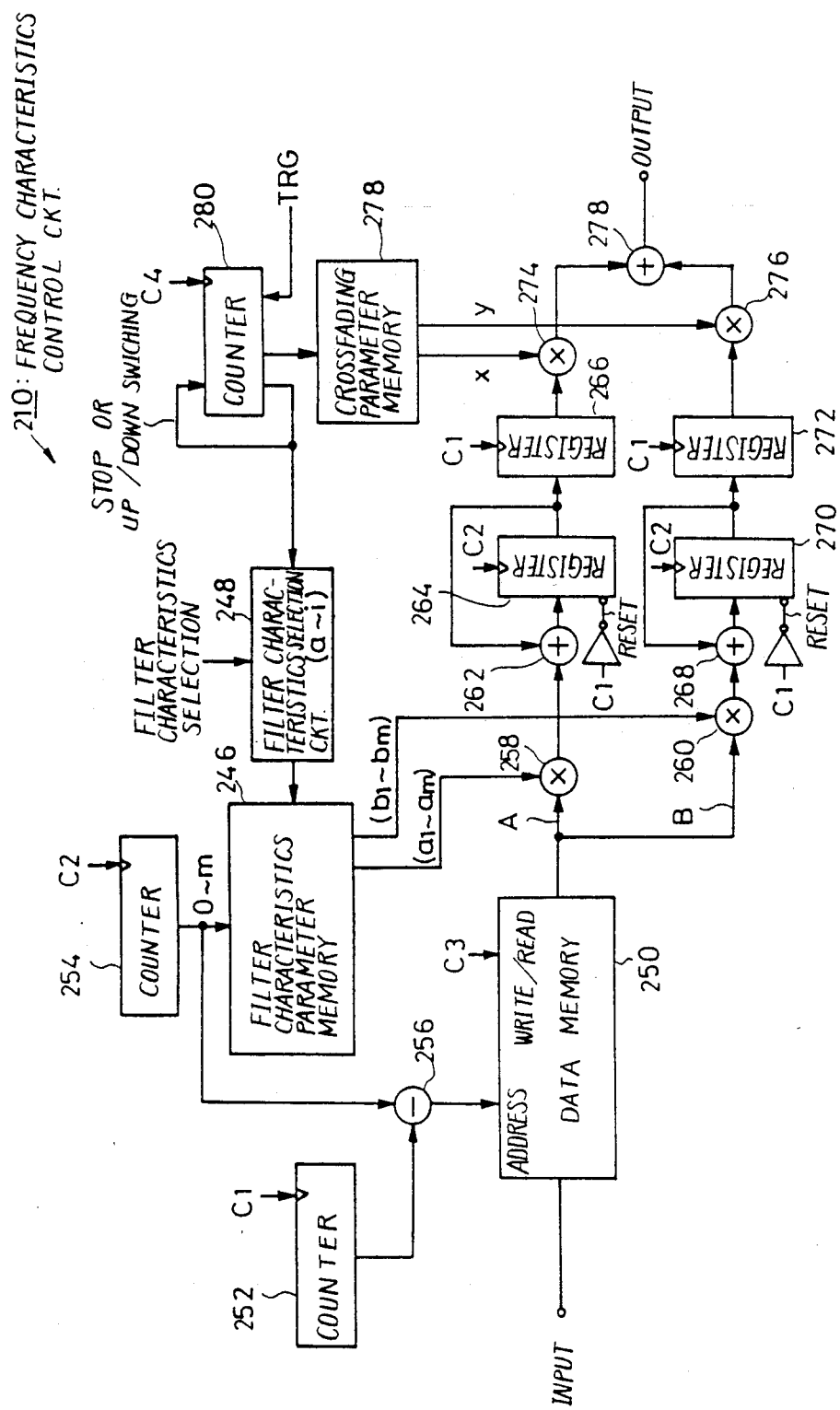
FIG. 30 is a block diagram showing an example of the frequency characteristics control circuit 210 of FIG. 6 constructed of a non-circulating type filter.
Figure 31:
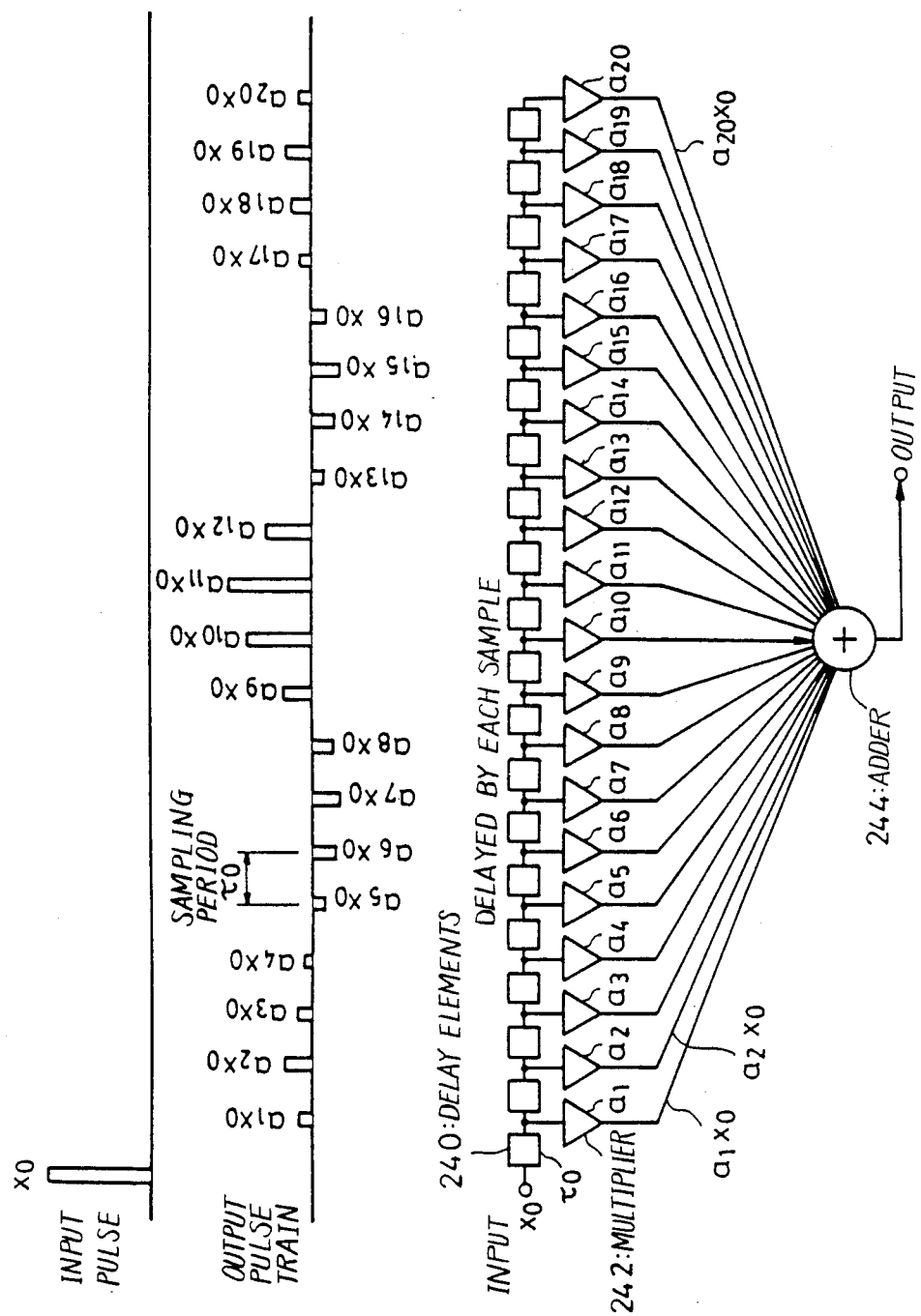
FIG. 31 is a diagram showing the principle of the non-circulating type filter.
Figure 32:
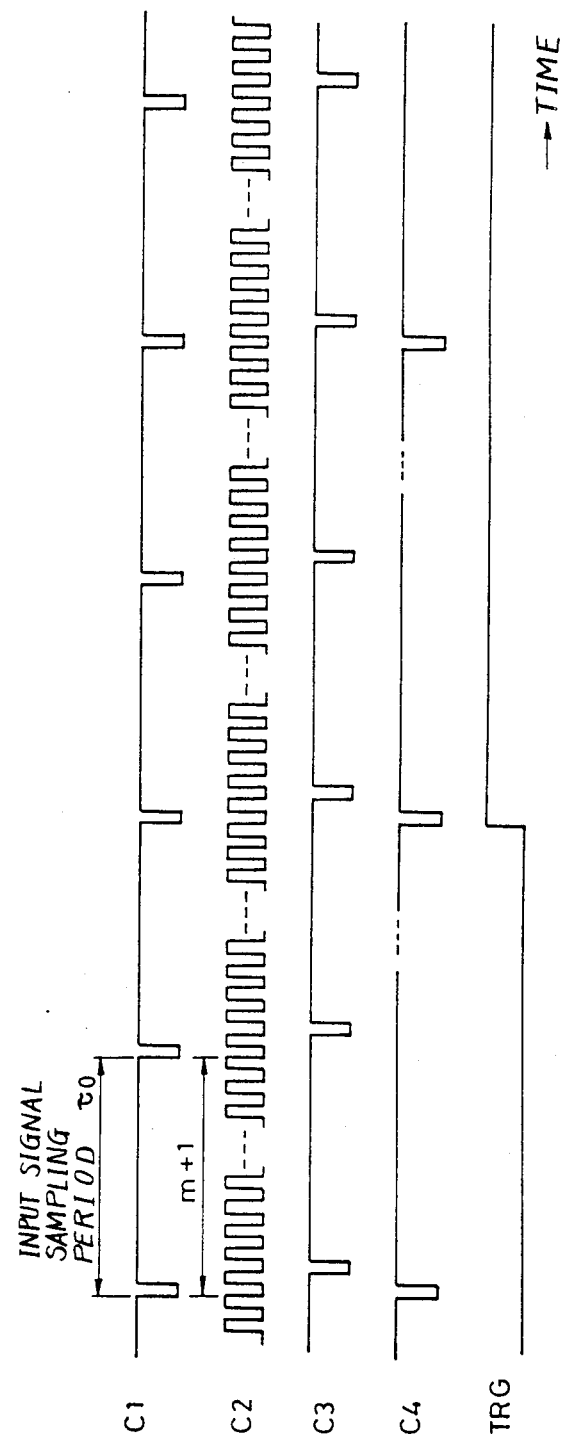
FIG. 32 is a time chart showing operation of the circuit of FIG. 30.

A specific example of the frequency characteristics control circuit 210 in FIG. 25 in which the filters 216 and 218 are constructed of the FIR filters is shown in FIG. 30. In this circuit, as shown in FIG. 31 for example, an input signal $x_0$ is delayed by one sampling period $\tau_0$ sequentially by delay elements 240, delay outputs of respective stages (the filter characteristics are formed by twenty sample points in this example) are provided with coefficients $a_1$ to $a_{20}$ by multipliers 242 and values $a_1 x_0$ to $a_{20} x_0$ are accumulated by an adder 244 (i.e., by convolution operation) to impart the input signal $x_0$ with low-pass filter characteristics. The filter characteristics are determined by the values of the coefficients $a_1$ to $a_{20}$. In the circuit of FIG. 30, the above described operation is achieved by a program control using a RAM. Control signals used in the circuit of FIG. 30 are shown in FIG. 32.

In FIG. 30, a filter characteristics parameter memory 246 stores values of coefficients $a_1$ to $a_m$, $b_1$ to $b_m$, . . . , $i_1$ to $i_m$ (in a case where the filter characteristics are formed by m sample points) which determine respective filter characteristics to be established (for characteristics a through i shown in FIG. 28) at respective addresses as shown in the following Table 3.

TABLE 3

| | Storage in the filter characteristics parameter memory 246 | | | | | |
|---|---|---|---|---|---|---|
| | corresponding delay time (: one sampling | filter characteristics | | | | |
| address | period) | a | b | c | ... | i |
| 0 | $\tau_0$ | $a_1$ | $b_1$ | $c_1$ | ... | $i_1$ |
| 1 | $2\tau_0$ | $a_2$ | $b_2$ | $c_2$ | ... | $i_2$ |
| 2 | $3\tau_0$ | $a_3$ | $b_3$ | $c_3$ | ... | $i_3$ |
| 3 | $4\tau_0$ | $a_4$ | $b_4$ | $c_4$ | ... | $i_4$ |
| . | . | . | . | . | ... | . |
| . | . | . | . | . | ... | . |
| m | $m\tau_0$ | $a_m$ | $b_m$ | $c_m$ | ... | $i_m$ |

A filter characteristics selection circuit 248 selects two filter characteristics from among those (a–i) stored in the filter characteristics parameter memory 246.

A data memory 250 has (m+1) addresses. Addresses are renewed sequentially from one at which the oldest sample is written and new samples are written sequentially at the renewed addresses. By this arrangement, (m+1) past samples counting from the present one are always stored in the data memory 250.

A counter 252 designates write address of the data memory 250. The counter 252 is counted up by clock C1 which is generated at each sampling period $\tau_0$ of the input signal and repeats counting from 0 upon reaching the count m.

A counter 254 designates read addresses of the filter characteristics parameter memory 246 and the data memory 250. The counter 254 is counted up from 0 to m by clock C2 which is generated (m+1) times during each sampling period $\tau_0$. The count of the counter 254 is subtracted from the count of the counter 252 by a subtractor 256 and the difference is applied to the data memory 250 as its address.

The data memory 250 is changed to a write mode by clock C3 when the value of the counter 254 is 0 and is in a readout mode at other counts of the counter 254. Accordingly, the count of the counter 252 is directly applied to the data memory 250 as a write address during the write mode and the input sample is written at this address. After writing, the data memory 250 is restored to the read mode and the counter 254 is sequentially counted up by clock C2. The count of the counter 254 is subtracted from the count of the counter 252 (i.e., address of the newest data) by the subtractor 256 and samples which are one sample, two samples, . . . , m samples before the present one are sequentially read out within one sampling period $\tau_0$.

The filter characteristics parameter memory 246 delivers out, sequentially and in parallel, coefficients ($a_1$ to $a_m$, $b_1$ to $b_m$) for the two filter characteristics (e.g., a and b) among filter characteristics a through i shown in Table 3 selected by the filter characteristics selection circuit 248.

Output data of the data memory 250 is applied to two channels A and B and provided by multipliers 258 and 260 with the coefficients of filter characteristics sequentially supplied from the filter characteristics parameter memory 246. Since reading of the delayed data and reading of the coefficients of filter characteristics are synchronized with each other by the counter 254, coefficients corresponding to the read out delayed data are provided by the multipliers 258 and 260.

The output data of the multiplier 258 is sequentially accumulated by an accumulator consisting of an adder 262 and a register 264 and a total accumulated value of m data derived within the period $\tau_0$ is latched in a register 266 in accordance with clock C1. As the total accumulated value has been latched in the register 266, the register 264 is reset by an inverted signal of clock C1 to prepare for accumulation in a next sampling period.

The output data of the multiplier 260 is processed in the same manner.

In the foregoing manner, data derived by providing the input signal with the filter characteristics selected by the filter characteristics selection circuit 248 are delivered out of the registers 266 and 272 and these data are imparted with the crossfading coefficients x and y by multipliers 274 and 276.

A crossfading parameter memory 278 stores the coefficients x and y (see FIG. 26) in addresses shown, for example, in the following Table 4.

TABLE 4

| Storage of crossfading parameter memory 278 | | |
|---|---|---|
| | crossfading coefficients | |
| address | x | y |
| 0 | 1.0 | 0.0 |
| 1 | 0.9 | 0.1 |
| . | . | . |
| . | . | . |
| . | . | . |
| 9 | 0.1 | 0.9 |
| 10 | 0.0 | 1.0 |

When a counter 280 is triggered by a trigger signal TRG, it is counted up by clock C4 which is of a much longer period than one sampling period $\tau_0$ of the input signal. The count of the counter 280 is applied to the memory 278 as its address so as to sequentially deliver out the coefficients x and y shown in Table 4. The output data of the multipliers 274 and 276 are added together by an adder 278 which produces its output at the sampling period $\tau_0$ which is the same as the one of the input signal. In the foregoing manner, the filter characteristics are gradually changed from those of the channel A to those of the channel B.

When the filter characteristics have been completely changed from those of the channel A to those of the channel B (i.e., when the count of the counter 280 has become 10), the filter characteristics of the channel B are continuously provided if the counting of the counter 280 is stopped.

Alternatively, when the filter characteristics have been completely changed from the channel A to the channel B, it is also possible to gradually change the filter characteristics from those of the channel B to new characteristics of the channel A if the channel A is switched to such new characteristics and the counter 280 is switched to downcounting. Likewise, when the count of the counter 280 has been downcounted to 0, the filter characteristics can be changed from those of the channel A to new characteristics of the channel B if the channel B is switched to such new characteristics and the counter 280 is switched to upcounting. In this manner, changing of the filter characteristics as shown in FIG. 27 can be realized.

For the reverberation imparting circuit 212 and coefficient memory 214 used in the embodiment of FIG. 22 (i.e., one in which the filter characteristics are imparted to the input signal before reverberation is imparted thereto) and in the embodiment of FIG. 24 (i.e., one in which the filter characteristics are provided to the signal after reverberation is imparted thereto), ones as shown in FIG. 19 can be adopted.

According to the embodiment shown in FIG. 23 in which the filter characteristics are provided to the signal after reverberation is imparted thereto, it is possible to change the filter characteristics gradually with attenuation of the reverberation signal as shown in FIG. 27 when the input signal has been interrupted. On the other hand, in the embodiment shown in FIG. 22 in which the filter characteristics are provided to the input signal before reverberation is imparted thereto, no reverberation signal which is gradually attenuated as the input signal shown in FIG. 27 cannot be obtained on the input terminal side of the frequency characteristics control circuit 210 when the input signal has been interrupted and it is not possible to change the filter characteristics gradually with attenuation of the reverberation signal by combination of the frequency characteristics control circuit 210 of FIG. 30 and the reverberation imparting circuit of FIG. 19.

Figure 33:
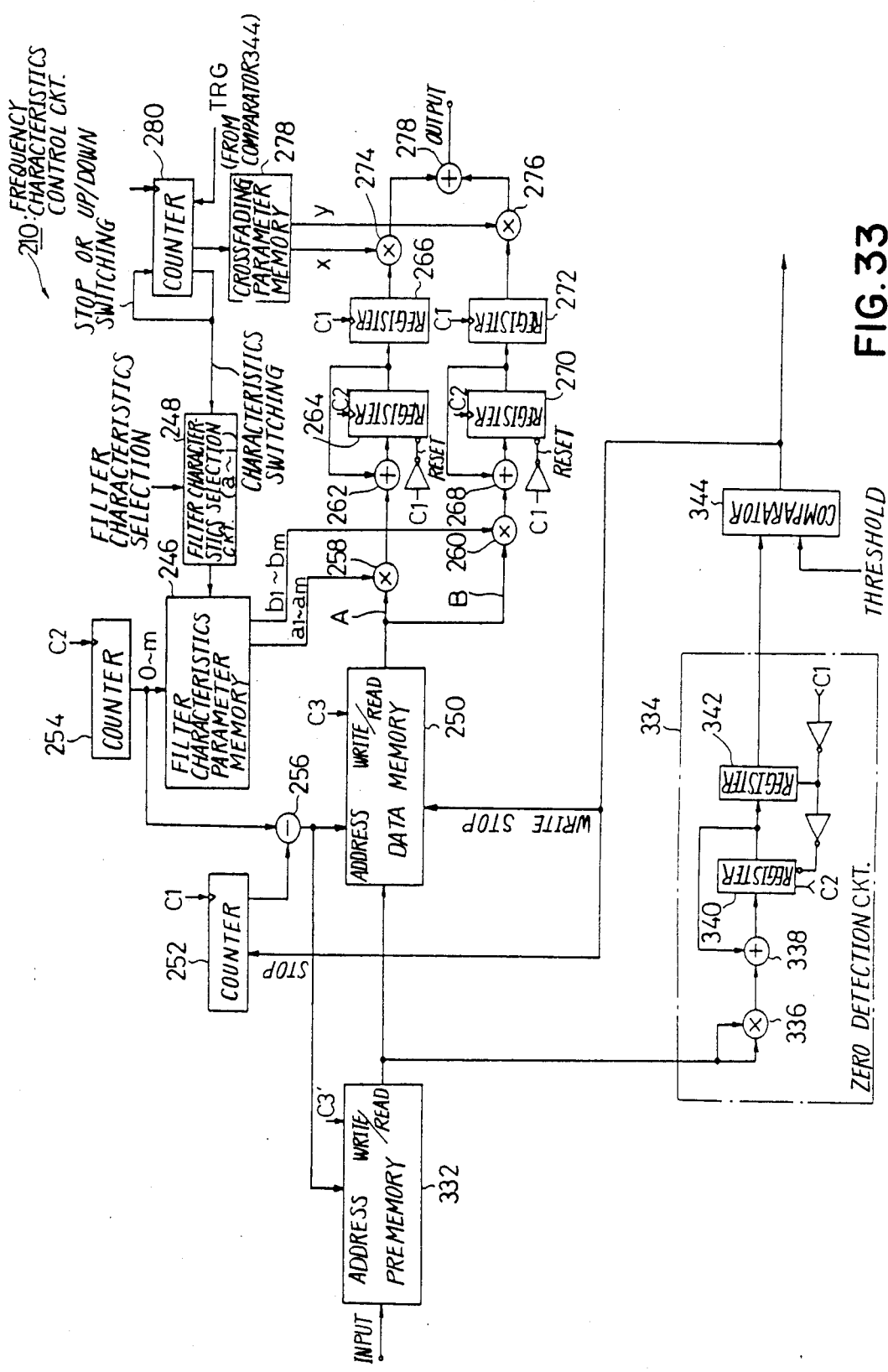
FIGS. 33 and 34 are block diagrams showing respectively a frequency characteristics control circuit 210 and a reverberation imparting circuit 212 for realizing the filter characteristics switching operation shown in FIG. 27.
Figure 34:
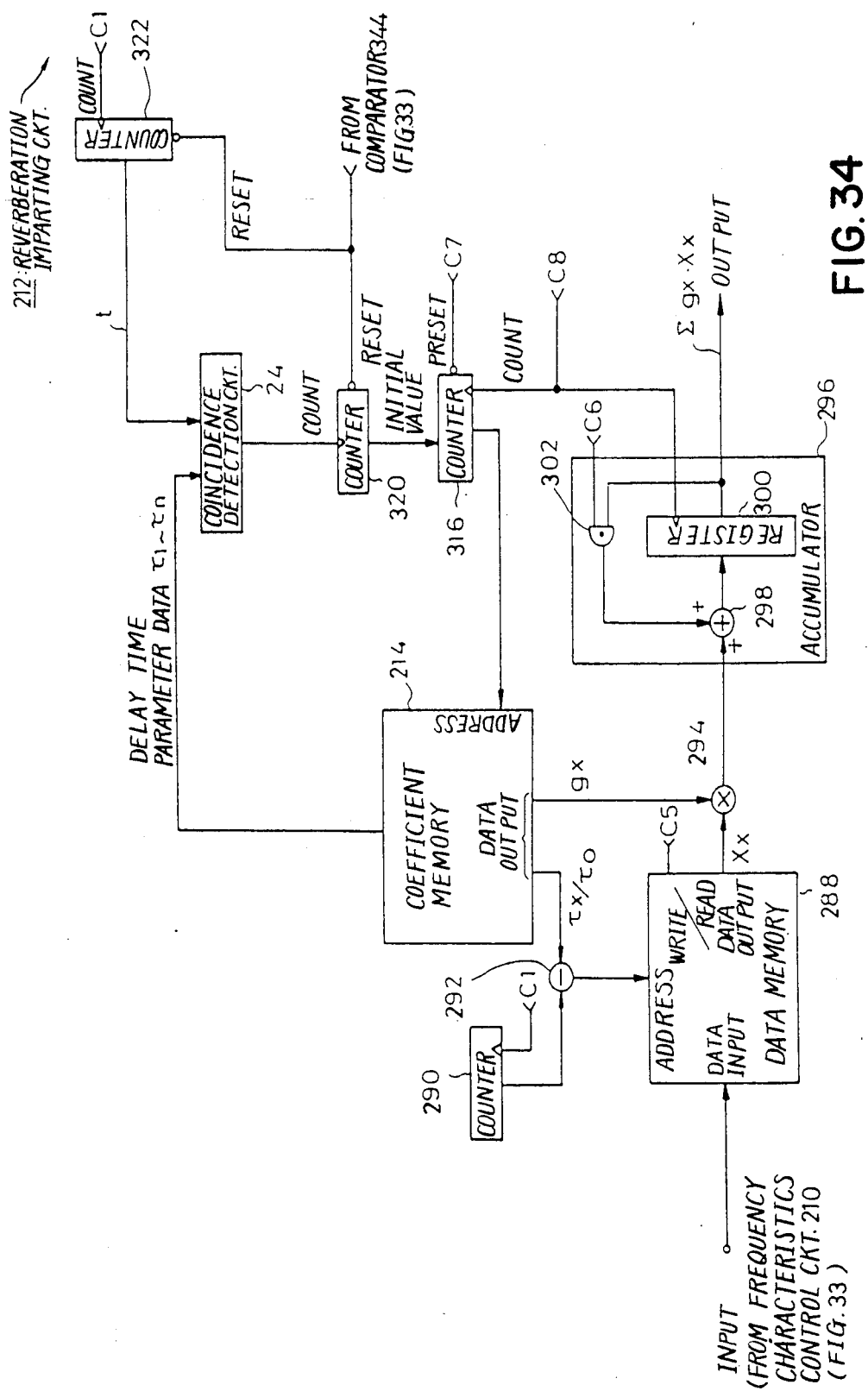

FIGS. 33 and 34 show an example each of a frequency characteristics control circuit and a reverberation imparting circuit which enable the filter characteristics to be changed with attenuation of the reverberation signal even in the embodiment of FIG. 22.

A frequency characteristics control circuit 210 shown in FIG. 33 comprises a prememory 332 provided on the input side thereof which temporarily stores an input signal and thereafter supplies it to a data memory 250. A sustain/interruption state of the input signal is detected by a zero detection circuit 334 in response to data stored in the prememory 332 and, upon detection of interruption of the input signal, writing in the data memory 250 is stopped and data of the input signal immediately before the interruption thereof is held and repeatedly read out by the data memory 250. The read out data is imparted with the filter characteristics and is processed by the convolution operation to form reverberation signal while the filter characteristics are gradually changed. The reverberation imparting circuit 212 shown in FIG. 34 imparts, by using the adaptive type convolution operation, reverberation to the output of the frequency characteristics control circuit 210 with the changing filter characteristics.

The circuits of FIGS. 33 and 34 will now be described in detail. In these figures, the same component parts are those shown in FIGS. 19 and 30 are designated by the same reference characters and detailed description thereof is omitted.

In FIG. 33, the prememory 332 performs writing and reading of the input signal using the same address signal as used in the data memory 250. Write clock C3' for writing in the prememory 332 is a signal which is generated a short length of time later than write clock C3. Accordingly, when reading is performed at a next write address in the prememory 332, data being read out from the prememory 332 by clock C3 is written in the data memory 250 so that data which is delayed by the capacity of the prememory 332 is written in the data memory 250. Immediately thereafter, writing in the prememory 332 is performed by clock C3'.

A zero detection circuit 334 is of the same construction as the one shown in FIG. 19 except that clock C2 is used for transferring clock in a register 340. The output of this zero detection circuit 334 is applied to a comparator 344 and, when it is smaller than a predetermined threshold value, it is judged that the input signal has been interrupted. Thereupon, new writing in the data memory 250 is stopped and the counter 252 stops its counting. Data of the input signal immediately before interruption is held in the data memory 250 and this data is repeatedly read out each sampling period $\tau_0$ and is provided with coefficients of filter characteristics read out from a filter characteristics parameter memory 246 whereby the reverberation signal with filter characteristics imparted thereto is obtained by the convolution operation.

At this time, the counter 280 is started in response to the output of the comparator 344 which constitutes a trigger signal TRG and the crossfading parameter memory 278 sequentially delivers out crossfading coefficients x and y for effecting crossfading between frequency characteristics of the channel A and frequency characteristics of the channel B. Each time one channel has been completely attenuated, upcounting and downcounting of the counter is switched and the filter characteristics of the channel which has been attenuated are changed. By this arrangement, a signal is produced with sequentially changing filter characteristics from the frequency characteristics control circuit 210 even after the input signal has been interrupted.

In the reverberation imparting circuit 212, the output signal of the frequency characteristics control circuit 210 of FIG. 33 is applied to a data memory 288 and imparting of reverberation by the convolution operation is performed. Upon detection of a state in which the input signal has been interrupted by a comparator 344 in FIG. 33, counters 320 and 322 are released from a reset state and the adaptive type operation is now performed. More specifically, time elapsed from shifting to the adaptive type operation is counted by the counter 322, a pulse is produced by a coincidence detection circuit 324 when the time elapsed coincides with delay time parameters $\tau_1$ to $\tau_n$. This pulse is counted by a counter 320 to sequentially increase the initial value of a counter 316 and thereby sequentially change read address of a coefficient memory 214 to a more significant bit with a result that the parameter of the impulse response used for imparting of reverberation is sequentially shifted from the initial stage to the middle and last stages. The adaptive type operation is performed in this manner. In this case, a signal whose filter characteristics are sequentially changed is applied from the frequency characteristics control circuit 210 of FIG. 33 to the input of the reverberation imparting circuit 212 of FIG. 34 and, accordingly, the reverberation imparting circuit 212 produces a reverberation signal whose filter characteristics are sequentially changed. In this manner, the control shown in FIG. 27 is realized in the embodiment shown in FIG. 22.

A specific example of the embodiment of FIG. 24 will now be described.

The embodiment of FIG. 24 is one in which, as was previously described, filter characteristics are imparted to the parameters themselves of the impulse response for imparting of reverberation. This embodiment is intended to change the pattern of the impulse response through a filter and obtain a reverberation signal imparted with desired filter characteristics by performing the convolution operation using this changed impulse response.

Figure 35:
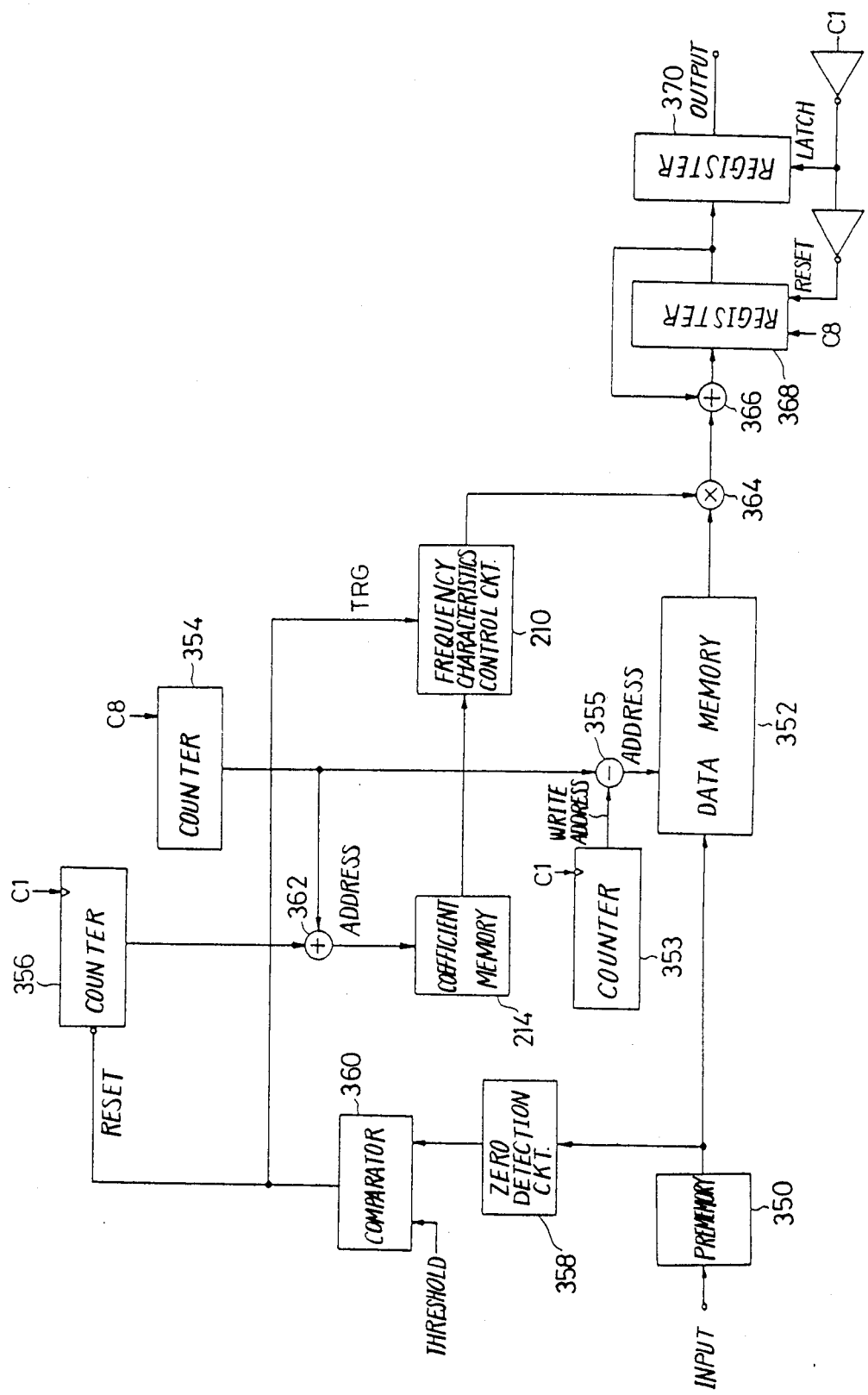
FIG. 35 is a block diagram showing a specific example of the embodiment of FIG. 24.

An example of the embodiment of FIG. 24 is shown in FIG. 35.

In FIG. 35, the input signal is once stored in a prememory 350 for detecting a sustain/interruption state and thereafter is transferred to a data memory 352.

Figure 36:
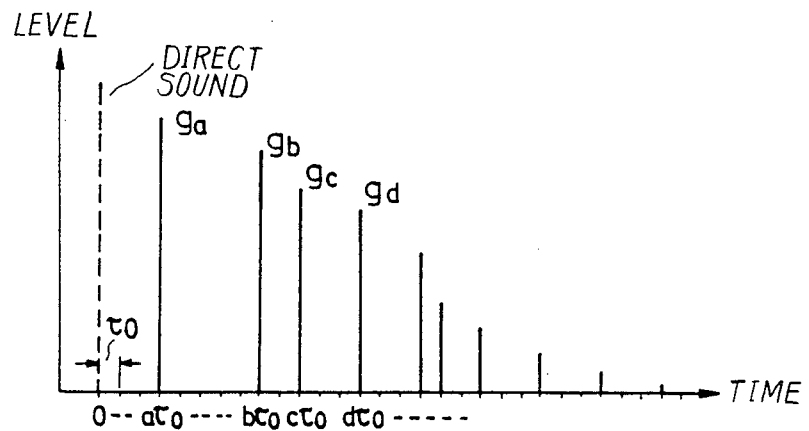
FIG. 36 is a diagram showing an example of parameters of the impulse response to be stored in a coefficient memory 214.

The coefficient memory 214 stores coefficient parameters of the impulse response for imparting reverberation. Since the impulse response is produced intermittently as shown in FIG. 36, the coefficient memory 214 in the embodiment of FIG. 34 stores the impulse response represented by parameters of delay time and level with respect to portions in which reflecting sound exists. In the present example, for imparting filter characteristics to the impulse response itself, levels of reflecting sound for respective sampling periods $\tau_0$ are stored as data in which the impulse response is arranged in time sequence. The level in a portion in which no reflecting sound exists is stored also as reflecting sound of level 0. The following Table 5 shows, by way of example, contents stored in the coefficient memory 214 in the case of using the impulse response of FIG. 36.

TABLE 5

| | Storage of coefficient memory 214 | |
|---|---|---|
| address | corresponding delay time | coefficient parameter of impulse response |
| 0 | 0 | 0 |
| 1 | $\tau_0$ | 0 |
| 2 | $2\tau_0$ | 0 |
| . | . | . |
| . | . | . |
| . | . | . |
| a − 1 | (a − 1)$\tau_0$ | 0 |
| a | a$\tau_0$ | $g_a$ |
| a + 1 | (a + 1)$\tau_0$ | 0 |
| . | . | . |
| . | . | . |
| . | . | . |
| b | b$\tau_0$ | $g_b$ |
| . | . | . |
| . | . | . |
| . | . | . |
| c | c$\tau_0$ | $g_c$ |
| . | . | . |
| . | . | . |
| d | d$\tau_0$ | $g_d$ |
| . | . | . |
| . | . | . |

The coefficient memory 214 stores data for each sampling period $\tau_0$ and the address itself corresponds to the delay time so that it is not necessary to store data of delay time.

In FIG. 35, a counter 353 designates write address for a data memory 352 and is counted up by clock C1 each sampling period $\tau_0$. A counter 354 designates read addresses for the data memory 352 and the coefficient memory 214 is counted up by predetermined counts by clock C8 each sampling period $\tau_0$. A subtractor 355 supplies a count derived by subtracting the count of the counter 354 from the count of the counter 353 to the data memory 352 as its read address.

A zero detection circuit 358 detects the level of the input signal in accordance with contents stored in the prememory 350. The circuit 358 is constructed, for example, so as to calculate a sum of squares of data stored in the prememory 350.

A comparator 360 compares the output of the zero detection circuit 358 with a predetermined threshold value and thereby judges a sustain/interruption state of the input signal.

A counter 356 produces an initial address for the adaptive type operation parameter. In a sustain state, the counter 356 is reset by the output of the comparator 360. At this time, therefore, an adder 362 supplies the count of the counter 354 directly to the coefficient memory 214 as a read address command and the coefficient memory 214 thereupon delivers out the coefficient parameters starting from the address 0. When the input signal has been interrupted, the counter 356 is released from a reset state and is counted up each sampling period $\tau_0$. Accordingly, the region of read address in the coefficient memory 214 is shifted by one address each sampling period $\tau_0$ so that coefficient parameters of impulse response of less significant bits are sequentially read out. In the foregoing manner, reading of the adaptive type operation parameters is performed.

The impulse response coefficient parameters provided by the coefficient memory 214 are applied to the frequency characteristics control circuit 210. The frequency characteristics control circuit 210 is constructed, for example, in the same manner as the one in FIG. 30 to impart desired filter characteristics to the coefficient parameters of the input impulse response. In the case of using the frequency characteristics control circuit 210 of FIG. 30, the period of its input signal (impulse response coefficient parameter) is not the period $\tau_0$ of clock C1 but the period of clock C8 so that the speed of the convolution operation for imparting filter characteristics in the circuit of FIG. 30 is changed accordingly.

Figure 37:
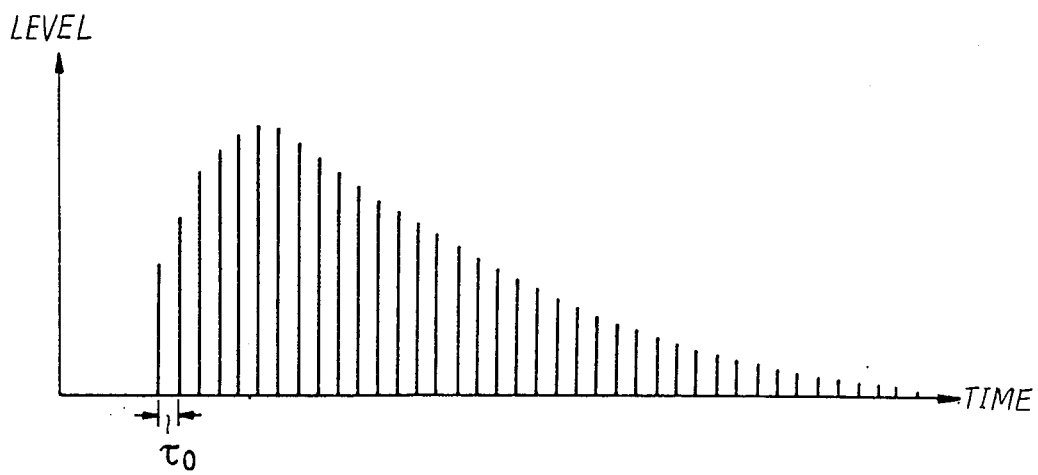
FIG. 37 is a diagram showing parameters of the impulse response imparted with the filter characteristics produced by a frequency characteristics control circuit 210 in FIG. 35.

An example of imparting filter characteristics to the coefficient parameter of impulse response of FIG. 36 by passing it through the frequency characteristics control circuit 210 is shown in FIG. 37 (FIG. 37 shows a case where not coefficient parameters of the adaptive type operation but all coefficient parameters are passed).

The coefficient parameters of impulse response imparted with filter characteristics sequentially read out from the frequency characteristics control circuit 210 at a period of clock C8 are multiplied in a multiper 364 with data of the input signal delivered out of the data memory 352 in synchronism with the coefficient parameters. Results of the multiplication are accumulated by an accumulator consisting of an adder 366 and a register 368 and a total accumulated value obtained for each sampling period $\tau_0$ is latched in a register 370 by clock C1. In this manner, a reverberation signal imparted with frequency characteristics is produced by the register 370.

The output of the comparator 360 can be used as a filter characteristics crossfading trigger signal TRG (FIG. 30) in the frequency characteristics control circuit 210. In the construction of FIG. 35 also, it is possible to perform a control for sequentially changing the filter characteristics in accordance with attenuation of the reverberation sound as shown in FIG. 27.

What is claimed is:

1. A reverberation imparting device comprising:
   a prememory sequentially storing an input signal;
   level detection means responsive to data stored in the prememory for detecting presence or absence of the input signal;
   a data memory sequentially storing the input signal delivered out of the prememory after delay of a predetermined time length;
   fixed type convolution operation means for producing a reverberation signal with respect to the data stored in the prememory by using an initial portion of parameters of a reflected sound;
   adaptive type convolution operations means for producing a reverberation signal with respect to data stored in the data memory by using a plurality of parameters among the parameters of the reflected sound other than the initial portion used by the fixed type convolution operation means, except parameters corresponding to a portion of the reflected sound in which the absence of the input signal has been detected by the level detection means; and
   addition means for adding resulting outputs of the fixed type convolution operation means and the adaptive type convolution operation means and delivering out the result of the addition as a reverberation imparted output signal.

2. A reverberation imparting device as defined in claim 1 further comprising:
   a frequency characteristics control circuit for controlling frequency characteristics of the reverberation imparted output signal; and
   frequency characteristics setting means for timewise changing the filter characteristics of the frequency characteristics control circuit.

3. A reverberation imparting device as defined in claim 2 wherein said frequency characteristics control circuit is provided in the reverberation imparting device and imparts filter characteristics to data before a reverberation sound is produced in the reverberation imparting device.

4. A reverberation imparting device as defined in claim 2 wherein said frequency characteristics control circuit is provided in the reverberation imparting device and imparts filter characteristics to data after a reverberation sound has been produced in the reverberation imparting device.

5. A reverberation imparting device as defined in claim 2 wherein said frequency characteristics control circuit imparts filter characteristics to the parameters of the reflected sound in the reverberation imparting device.

* * * * *